US011031570B2

(12) United States Patent
Mishima

(10) Patent No.: US 11,031,570 B2
(45) Date of Patent: Jun. 8, 2021

(54) ORGANIC EL ELEMENT, METHOD OF MANUFACTURING ORGANIC EL ELEMENT, ORGANIC EL PANEL, ORGANIC EL DISPLAY DEVICE AND ELECTRONIC APPARATUS

(71) Applicant: JOLED Inc., Tokyo (JP)

(72) Inventor: Kosuke Mishima, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 16/663,389

(22) Filed: Oct. 25, 2019

(65) Prior Publication Data

US 2020/0136079 A1 Apr. 30, 2020

(30) Foreign Application Priority Data

Oct. 31, 2018 (JP) .............................. JP2018-205570

(51) Int. Cl.
*H01L 51/00* (2006.01)
*H01L 51/50* (2006.01)
(Continued)

(52) U.S. Cl.
CPC ...... *H01L 51/5092* (2013.01); *H01L 27/3246* (2013.01); *H01L 51/0005* (2013.01); *H01L 51/5012* (2013.01); *H01L 51/5072* (2013.01); *H01L 51/5218* (2013.01); *H01L 51/5234* (2013.01); *H01L 51/5265* (2013.01);
(Continued)

(58) Field of Classification Search
CPC ......... H01L 51/00; H01L 51/50; H01L 51/52; H01L 51/56; H01L 51/5092; H01L 51/5012; H01L 51/5218; H01L 51/5234; H01L 51/5265; H01L 51/5072; H01L 51/0005; H01L 51/0032; H01L 51/0095; H01L 27/32; H01L 27/3246;
(Continued)

(56) References Cited

U.S. PATENT DOCUMENTS

2005/0249974 A1 11/2005 Mori et al.
2007/0228356 A1* 10/2007 Makiura ............. H01L 51/5092
257/13
(Continued)

FOREIGN PATENT DOCUMENTS

JP 2005-243411 A 9/2005
JP 2008-243932 A 10/2008
(Continued)

*Primary Examiner* — Chuong A Luu
(74) *Attorney, Agent, or Firm* — Xsensus LLP

(57) ABSTRACT

An organic electroluminescence element includes an anode, an organic light emitting layer disposed on an upper side of the anode, a functional layer which is disposed over the organic light emitting layer, in which a rare earth metal and other material are present mixedly, and in which part of the rare earth metal is oxidized, and a cathode disposed on an upper side of the functional layer. A method of manufacturing an organic electroluminescence element includes forming an anode, forming an organic light emitting layer on an upper side of the anode, forming over the organic light emitting layer a functional layer in which a rare earth metal and other material are present mixedly and part of the rare earth metal is oxidized, and forming a cathode on an upper side of the functional layer.

13 Claims, 15 Drawing Sheets

(51) Int. Cl.
*H01L 27/32* (2006.01)
*H01L 51/52* (2006.01)
*H01L 51/56* (2006.01)

(52) U.S. Cl.
CPC ........ *H01L 51/56* (2013.01); *H01L 2227/323* (2013.01); *H01L 2251/5315* (2013.01); *H01L 2251/558* (2013.01)

(58) Field of Classification Search
CPC ............. H01L 27/3225; H01L 27/3297; H01L 2227/323; H01L 2251/558; H01L 2251/5315
USPC .......................................................... 257/40
See application file for complete search history.

(56) References Cited

U.S. PATENT DOCUMENTS

| | | |
|---|---|---|
| 2009/0128012 A1 | 5/2009 | Song et al. |
| 2011/0309739 A1 | 12/2011 | Song et al. |
| 2013/0092918 A1* | 4/2013 | Okumoto ................ H01L 51/56 257/40 |
| 2017/0133437 A1 | 5/2017 | Komatsu |
| 2017/0346037 A1 | 11/2017 | Huang et al. |
| 2018/0248154 A1 | 8/2018 | Shirahase et al. |

FOREIGN PATENT DOCUMENTS

| | | |
|---|---|---|
| JP | 2009-124138 A | 6/2009 |
| JP | 2012-004116 A | 1/2012 |
| JP | 2017-224808 A | 12/2017 |
| JP | 2018-139262 A | 9/2018 |
| WO | 2015/194189 A1 | 12/2015 |

\* cited by examiner

EVALUATION STRUCTURE FOR
TRANSMITTANCE

EVALUATION STRUCTURE FOR
DRIVING VOLTAGE

ORGANIC EL ELEMENT, METHOD OF MANUFACTURING ORGANIC EL ELEMENT, ORGANIC EL PANEL, ORGANIC EL DISPLAY DEVICE AND ELECTRONIC APPARATUS

CROSS-REFERENCE TO RELATED APPLICATION

The present disclosure contains subject matter related to that disclosed in Japanese Priority Patent Application JP 2018-205570 filed in the Japan Patent Office on Oct. 31, 2018, the entire content of which is hereby incorporated by reference.

BACKGROUND

The present disclosure relates to an organic electroluminescence element (hereinafter referred to as "organic EL element"), a method of manufacturing the same, an organic EL panel in which the organic EL elements are arranged in a matrix pattern over a substrate, an organic EL display device using the organic EL panel as an image display section, and an electronic apparatus.

In recent years, as a light emission type display, an organic EL panel in which a plurality of organic EL elements are arranged along column and row directions (in a matrix pattern) over a substrate has been put to practical use as a display of electronic apparatuses. Each organic EL element is a current driving type light emitting element having a basic structure in which an organic light emitting layer including an organic light emitting material is disposed between a pair of electrodes consisting of an anode and a cathode. At the time of driving, a voltage is impressed between the pair of electrodes, and light is generated attendant on re-combination between holes injected from the anode into the organic light emitting layer and electrons injected from the cathode into the organic light emitting layer.

In such an organic EL element, an enhanced luminous efficiency and a prolonged life are constantly demanded.

The energy level of the LUMO (lowest unoccupied molecular orbital) of an organic material (particularly, a high polymer organic material) constituting the organic light emitting layer is in many cases largely different from the fermi level of the cathode material. Therefore, injection of electrons from the cathode into the organic light emitting layer may not be performed smoothly, and it is difficult to obtain a good luminous efficiency.

In view of this, in the related art, a functional layer (an electron injection layer and/or an electron transport layer, etc.) for supplying electrons to the organic light emitting layer has been provided between the organic light emitting layer and the cathode.

When this electron transport layer is configured using an organic material, it is difficult to sufficiently reduce the energy barrier between the cathode and the organic light emitting layer, so that enhancement of luminous efficiency is hardly expected. In addition, it may be contemplated to increase the number of electron transport layers to thereby gradually reduce the energy barrier, but this approach is low in productivity and leads to a rise in manufacturing cost.

In view of the foregoing, there has been proposed a configuration in which an organic material is doped with a metallic material low in work function such as Na, Cs and Ba, thereby enhancing an electron injecting property.

SUMMARY

However, alkali metals or alkaline earth metals (hereinafter referred to generically as "alkaline metals") such as Na, Cs and Ba are high in activity, and tend to react with moisture or the like in the organic light emitting layer, with the result of deterioration of characteristic properties thereof and shortening of life thereof.

Therefore, WO2015-194189A1 (hereinafter referred to as Patent Document 1) discloses a configuration in which an intermediate layer including a fluoride of an alkali metal is provided between the electron transport layer containing the alkaline metal and the organic light emitting layer, to thereby prevent moisture or the like in the organic light emitting layer from penetrating into the electron transport layer.

In this way, a large number of attempts have hitherto been made to realize both an enhanced luminous efficiency and a prolonged life of an organic EL element.

Thus, there is a need for an organic EL element capable of securing a further enhanced luminous efficiency and a prolonged life, a method of manufacturing the same, an organic EL panel in which the organic EL elements are arranged in a matrix pattern over a substrate, an organic EL display device using the organic EL panel as an image display section, and an electronic apparatus.

According to one mode of the present disclosure, there is provided an organic EL element including an anode, an organic light emitting layer disposed on an upper side of the anode, a functional layer which is disposed over the organic light emitting layer, in which a rare earth metal and other material are present mixedly, and in which part of the rare earth metal is oxidized, and a cathode disposed on an upper side of the functional layer.

In addition, according to another mode of the present disclosure, there is provided an organic EL panel in which a plurality of the organic EL elements according to the one mode described above are arranged in a matrix pattern on an upper side of a substrate, and the organic light emitting layers in at least the organic EL elements adjacent to each other in a row direction are partitioned from each other by a partition wall extending in a column direction.

Besides, according to a further mode of the present disclosure, there is provided an organic EL display device including the organic EL panel according to the another mode described above, and a driving section driving the organic EL panel to display an image.

In addition, according to yet another mode of the present disclosure, there is provided an electronic apparatus including the organic EL display device according to the further mode described above as an image display section.

Further, according to a yet further mode of the present disclosure, there is provided a method of manufacturing an organic EL element, including forming an anode, forming an organic light emitting layer on an upper side of the anode, forming over the organic light emitting layer a functional layer in which a rare earth metal and other material are present mixedly and part of the rare earth metal is oxidized, and forming a cathode on an upper side of the functional layer.

In accordance with the organic EL element and the method of manufacturing an organic EL element according to the above modes of the present disclosure, it is possible to provide an organic EL element, an organic EL panel, an organic EL display device and an electronic apparatus which are capable of securing a further enhanced luminous efficiency and a prolonged life.

DETAILED DESCRIPTION OF THE PREFERRED EMBODIMENT

Figure 1:
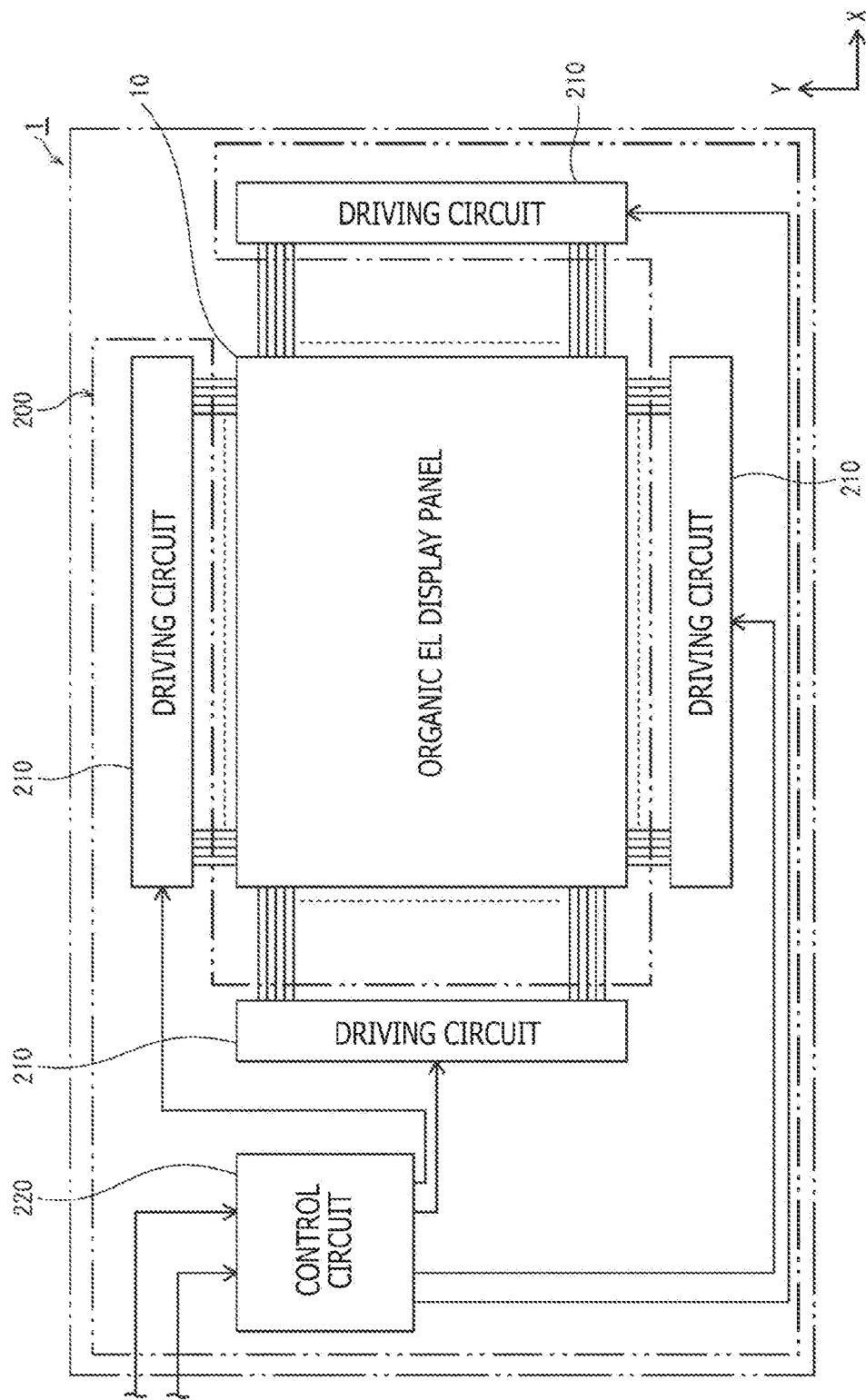
FIG. 1 is a block diagram depicting the general configuration of an organic EL display device according to a mode of the present disclosure.

<<How One Mode of the Present Disclosure has been Reached>>

As aforementioned, Patent Document 1 discloses a configuration in which for facilitating movement of electrons from a cathode to an organic light emitting layer, an electron transport layer including an organic material doped with an alkaline metal having a low work function is formed, thereby to maintain a good carrier balance and enhance the luminous efficiency of the organic light emitting layer, and an intermediate layer including a fluoride of an alkali metal is provided between an electron transport layer and the organic light emitting layer, to prevent deterioration of the alkaline metal by moisture from an underlying organic layer, thereby realizing a prolonged life.

In recent years, however, there has been a trend toward forming each organic layer of an organic EL element by a wet process, as much as possible, from the viewpoint of productivity and material use efficiency. As a result, the amount of moisture remaining in the organic layers increases, and, therefore, the film thickness of the intermediate layer playing the role of blocking the moisture should be enlarged. The fluoride of an alkali metal forming the intermediate layer is partly dissociated by reduction into the alkali metal (for example, Na), whereby an electron injecting property can be obtained. In general, such a reducing action is exhibited by a structure in which another alkaline metal as a highly reducing material is stacked as an upper layer over the intermediate layer. When the film thickness of the intermediate layer is increased, however, the reducing action of the upper layer is decreased at the intermediate layer, particularly at a lower layer portion of the intermediate layer, resulting in that driving voltage is raised, and it is difficult to sufficiently achieve the object to enhance the luminous efficiency.

In addition, in the case where the material including an organic material doped with an alkaline metal is stacked as an upper layer over the intermediate layer as in Patent Document 1, the reducing property is lowered as compared to the case of stacking of only the alkaline metal. When the film thickness of the intermediate layer is increased, therefore, the increase in the driving voltage is greater in this case, so that it may be impossible to sufficiently achieve the object to enhance the luminous efficiency.

On the other hand, a sealing layer is normally formed on the upper side of the cathode. However, even with the sealing layer thus provided, it cannot be said that there is no possibility that moisture might penetrate from an upper layer for the electron transport layer into the electron transport layer.

In view of the foregoing, the inventor of the present application came to an idea of using a rare earth metal in place of the alkaline metal in the electron transport layer. Rare earth metals are low in work function to an extent comparable to alkaline metals, but lower than the alkaline metals in reactivity with moisture, and, therefore, are expected to exhibit a prolonged life.

In addition, for enhancing the luminous efficiency, first, the light flux emitted from the organic light emitting layer should go out to the exterior of the organic EL element in a quantity as large as possible. For ensuring this, it is desirable that light transmittance (hereinafter referred to simply as "transmittance") of each of the layers ranging from the organic light emitting layer to the cathode is high.

Secondly, it is desirable that the driving voltage (the voltage when a predetermined current is applied to the cathode and the anode) is as low as possible. The luminous efficiency can be defined as the amount of luminescence per unit electric power supplied.

Based on the above-mentioned policy, the inventor of the present application made extensive and intensive investigations in search of a configuration by which luminous efficiency can be enhanced and a prolonged life can be realized while realizing a reduction in cost through adoption of a wet process; as a result of the investigations, one mode of the present disclosure has been reached.

<<Outline of One Mode of the Present Disclosure>>

An organic EL element according to one mode of the present disclosure includes an anode, an organic light emitting layer disposed on an upper side of the anode, a functional layer which is disposed over the organic light emitting layer and in which a rare earth metal and other material are present mixedly and part of the rare earth metal is oxidized, and a cathode disposed on an upper side of the functional layer.

According to such a mode, it is possible to provide an organic EL element which can secure a good luminous efficiency and realize a prolonged life.

Here, the other material is desirably a fluoride of a metal selected from among alkali metals and alkaline earth metals.

In the organic EL element according to another mode of the present disclosure, the content of the rare earth metal based on the total amount of the fluoride of the metal selected from among the alkali metals and the alkaline earth metals and the rare earth metal is more than 73 wt % and less than 100 wt %.

According to such a mode, driving voltage can be reduced while efficiently securing enhancement of transmittance of the functional layer by partially reducing the fluoride of the metal by the rare earth metal.

In an organic EL element according to a further mode of the present disclosure, the metal selected from among the alkali metals and the alkaline earth metals is Na, and the rare earth metal is Yb.

According to such a selection of metals, further enhancement of luminous efficiency can be expected.

The functional layer is desirably formed in contact with the organic light emitting layer.

This makes it possible to prevent moisture from penetrating from the organic light emitting layer, and to securely perform injection of electrons from the cathode into the organic light emitting layer.

In an organic EL element according to yet another mode of the present disclosure, a transparent conductive film including an inorganic oxide is formed in contact with the functional layer, between the functional layer and the cathode.

According to such a mode, adjustment of film thicknesses for an optical resonator structure is facilitated, and a second metal in the functional layer is oxidized in a manufacturing step, which enables a reduction in the number of steps and leads to a reduction in cost.

In an organic EL element according to a yet further mode of the present disclosure, the transparent conductive film is an ITO (indium tin oxide) film or an IZO (indium zinc oxide) film.

The ITO film or IZO film is excellent in transparency and conductivity, and contributes to enhancement of luminous efficiency.

In an organic EL element according to still another mode of the present disclosure, the anode has a light reflecting property, and the cathode has a semi-transparent property.

Here, light emitted from the organic light emitting layer includes a first light flux going out directly from the cathode, and a second light flux going out from the cathode after being reflected between the anode and the cathode, and the film thickness of the transparent conductive film is set according to the wavelength of the color in which the light is emitted in such a manner that the first light flux and the second light flux resonate.

This ensures that a higher order optical resonator structure can be built up, and the luminous efficiency is further enhanced.

An electron transport layer may be formed between the functional layer and the cathode.

This makes it possible to further increase a property of injecting or transporting electrons from the cathode into the organic light emitting layer.

The above-mentioned other material may be an organic material.

This ensures that the degree of freedom in selecting materials is increased, and a diversity of design can be expected.

The other material may be an oxide.

This ensures that when the functional layer is formed by causing the oxide to be present mixedly with the rare earth metal, oxidation of part of the rare earth metal can be realized simultaneously, whereby productivity is enhanced.

In an organic EL element according to a still further mode of the present disclosure, two or more organic light emitting layers are formed between the anode and the cathode, a charge generating layer is formed between the organic light emitting layers, the functional layer is formed between at least one of the organic light emitting layers and the charge generating layer, in contact with the charge generating layer, and the charge generating layer includes a metallic oxide.

This ensures that in the case where the organic EL element is of a tandem-type configuration, luminous efficiency can be further enhanced.

Here, the metallic oxide may be an oxide of Mo.

An organic EL panel according to another mode of the present disclosure includes a plurality of the above-mentioned organic EL elements arranged in a matrix pattern on an upper side of a substrate, and the organic light emitting layers in at least the organic EL elements adjacent to each other in a row direction are partitioned from each other by a partition wall extending in a column direction.

This makes it possible to provide an organic EL panel that is excellent in luminous efficiency and can be prolonged in life.

An organic EL panel according to a further mode of the present disclosure is of a top emission type.

In a top emission type organic EL panel, a driving circuit including a TFT (thin film transistor) or the like is not disposed in the direction in which light goes out; therefore, numerical aperture of each organic EL element can be enlarged, and the organic EL panel is excellent in luminous efficiency.

An organic EL display device according to yet another mode of the present disclosure includes the organic EL panel according to the above-mentioned mode, and a driving section driving the organic EL panel to display an image.

An electronic apparatus according to a yet further mode of the present disclosure includes the above-mentioned organic EL display device as an image display section in the above-mentioned mode.

Such an organic EL display device and such an electronic apparatus are excellent in luminous efficiency of a display panel, and are capable of realizing a prolonged life.

A method of manufacturing an organic EL element according to still another mode of the present disclosure includes: a first step of forming an anode; a second step of forming an organic light emitting layer on an upper side of the anode; a third step of forming over the organic light emitting layer a functional layer in which a rare earth metal and other material are present mixedly and part of the rare earth metal is oxidized; and a fourth step of forming a cathode on an upper side of the functional layer.

By such a mode, it is possible to manufacture an organic EL element that is excellent in luminous efficiency and is capable of displaying a good-quality image as aforementioned.

Here, the above-mentioned other material is a fluoride of a metal selected from among alkali metals and alkaline earth metals.

The third step includes: a vapor deposition step of co-depositing the rare earth metal and the other material over the organic light emitting layer; and an oxidation step of oxidizing part of the rare earth metal co-deposited.

This makes it possible to enhance transparency ratio (transmittance) of the functional layer.

A method of manufacturing an organic EL panel according to a still further mode of the present disclosure includes, between the above-mentioned third step and the fourth step, a transparent conductive film forming step of forming a transparent conductive film including an inorganic oxide over the functional layer, the transparent conductive film forming step functioning also as the above-mentioned oxidation step.

This reduces manufacturing cost.

In a method of manufacturing an organic EL panel according to another mode of the present disclosure, the above-mentioned transparent conductive film forming step is carried out by a sputtering method.

This ensures that the oxidation of the rare earth metal in the functional layer can be performed efficiently.

Note that in the above-mentioned modes of the present disclosure, the term "over" does not refer to the upward direction (vertically upward side) in an absolute space recognition, but is defined by a relative positional relation, based on the order of stacking in a stacked structure of the organic EL element. Specifically, in the organic EL element, the direction which is perpendicular to a main surface of the substrate and which is directed toward the stacked body side from the substrate is made to be an upward direction. In addition, for example, the expression "over the substrate" does not refer to only a region in direct contact with the substrate, but includes also a region on the upper side of the substrate with the stacked body interposed therebetween. Besides, for example, the expression "on an upper side of the substrate" does not refer to only an upper region spaced from the substrate by a gap, but includes also a region over (on) the substrate.

Embodiment

An organic EL element, an organic EL panel and an organic EL display device according to one mode of the present disclosure will be described below referring to the drawings. Note that the drawings include schematic ones, and contraction scales and aspect ratios of members may be different from the actual ones.

1. General Configuration of Organic EL Display Device 1

FIG. 1 is a block diagram depicting the general configuration of an organic EL display device 1. The organic EL display device 1 is a display device for use in, for example, television sets, personal computers, portable terminals, displays for business use (electronic signboards, large-sized screens for commercial facilities) or the like.

The organic EL display device 1 includes an organic EL panel 10, and a driving control section 200 electrically connected thereto.

The organic EL panel 10, in the present embodiment, is a top emission type display panel in which an upper surface is a rectangular image display surface. In the organic EL panel 10, a plurality of organic EL elements (not illustrated) are arranged along the image display surface, and an image is displayed by combining light emission of the organic EL elements. Note that the organic EL panel 10 adopts an active matrix system as an example.

The driving control section 200 includes driving circuits 210 connected to the organic EL panel 10, and a control circuit 220 connected to an external device such as a computer or a reception device such as an antenna. The driving circuit 210 includes a power source circuit that supplies electric power to each organic EL element, a signal circuit that applies a voltage signal for controlling electric power supplied to each organic EL element, a scanning circuit that switches over the part to which to apply the voltage signal on the basis of a predetermined interval, and so on.

The control circuit 220 controls the operation of the driving circuits 210 according to data including image information inputted from the external device or the reception device.

Note that while four driving circuits 210 are arranged in the periphery of the organic EL panel 10 as an example in FIG. 1, the configuration of the driving control section 200 is not limited to this, and the number and positions of the driving circuits 210 can be modified as required. In addition, for explanation hereinafter, as depicted in FIG. 1, the direction along the long sides of the upper surface of the organic EL panel 10 will be an X direction, and the direction along the short sides of the upper surface of the organic EL panel 10 will be a Y direction.

2. Configuration of Organic EL Panel 10

(A) Plan-View Configuration

Figure 2:
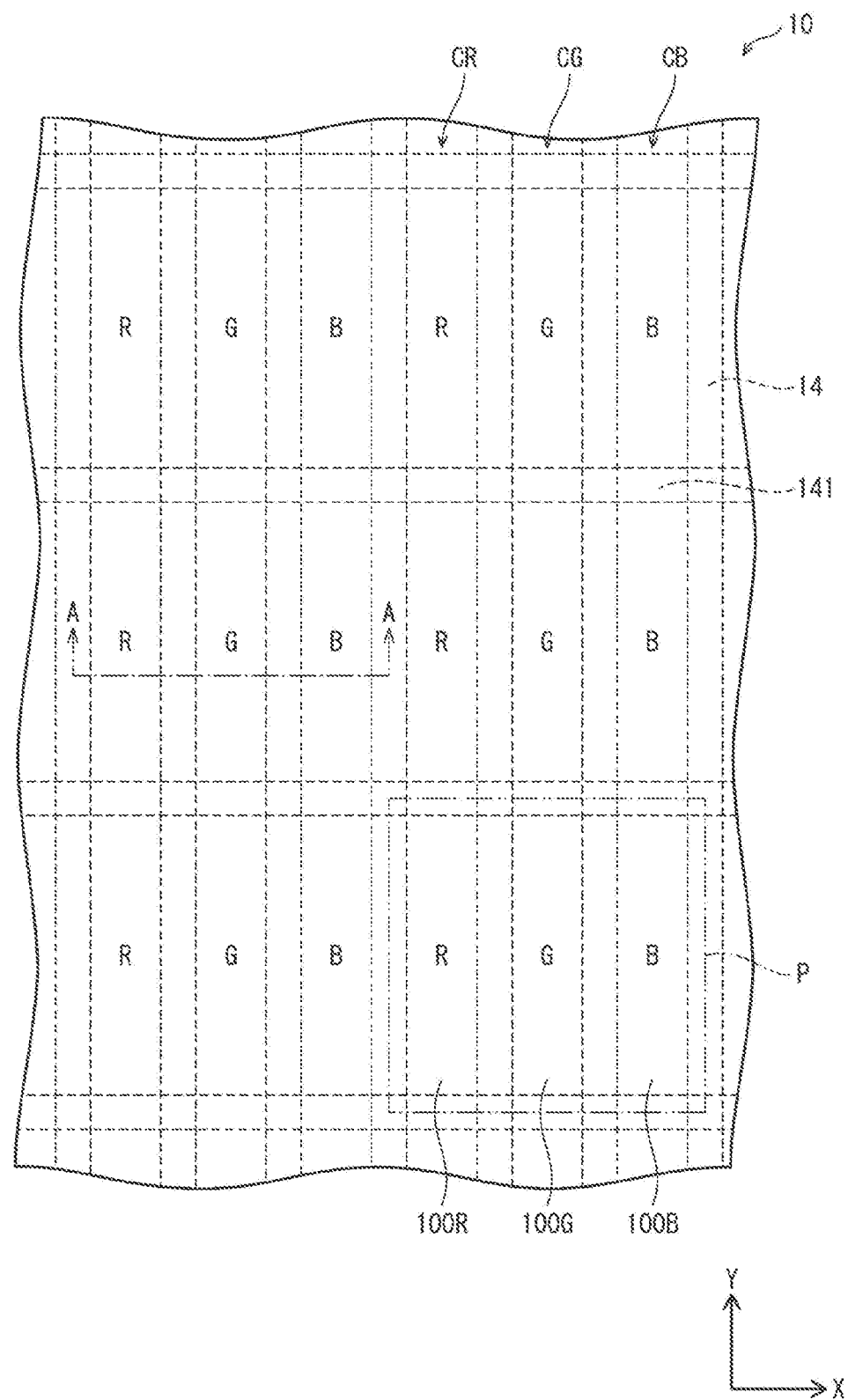
FIG. 2 is a schematic plan view depicting in an enlarged form a part of an image display surface of an organic EL panel in the organic EL display device.

FIG. 2 is a schematic plan view depicting, in an enlarged form, part of the image display surface of the organic EL panel 10. In the organic EL panel 10, as an example, sub-pixels 100R, 100G and 100B that emit light in R (red), G (green) and B (blue) (hereinafter referred also to simply as R, G and B) respectively are arranged in a matrix pattern. The sub-pixels 100R, 100G and 100B are alternately aligned in the X direction, and a set of sub-pixels 100R, 100G and 100B aligned in the X direction constitute one pixel P. In the pixel P, light emission luminances of the sub-pixels 100R, 100G and 100B subjected to gradation control are combined with one another, whereby a full-color expression can be achieved.

In addition, in the Y direction, only one kind of sub-pixels of the sub-pixels 100R, sub-pixels 100G and the sub-pixels 100B are aligned to constitute a sub-pixel column CR, a sub-pixel column CG or a sub-pixel column CB. As a result, in the organic EL panel 10 as a whole, the pixels P are aligned in a matrix pattern along the X direction and the Y direction, and, by combining the color light emissions of the pixels P aligned in the matrix pattern, an image is displayed on the image display surface.

In the sub-pixels 100R, 100G and 100B, organic EL elements 2(R), 2(G) and 2(B) (see FIG. 3) that emit light in colors R, G and B are disposed respectively.

Besides, in the organic EL panel 10 according to the present embodiment, a so-called line bank system is adopted. Specifically, a plurality of partition walls (banks) 14 that partition the sub-pixel columns CR, CG and CB on a column basis are disposed at spacings in the X direction, and, in each of the sub-pixel columns CR, CG and CB, the sub-pixels 100R, 100G and 100B share the organic light emitting layer.

It is to be noted, however, that in each of the sub-pixel columns CR, CG and CB, a plurality of pixel restricting layers 141 that insulate the sub-pixels 100R, 100G and 100B from one another are disposed at spacings in the Y direction, such that each of the sub-pixels 100R, 100G and 100B can emit light independently.

Note that the height of the pixel restricting layers 141 is smaller than the height of a liquid surface when inks for the organic light emitting layers are applied. In FIG. 2, the partition walls 14 and the pixel restricting layers 141 are depicted in dotted lines, since the pixel restricting layers 141 and the partition walls 14 are not exposed to the surface of the image display surface but are disposed inside the image display surface.

(B) Sectional Configuration

Figure 3:
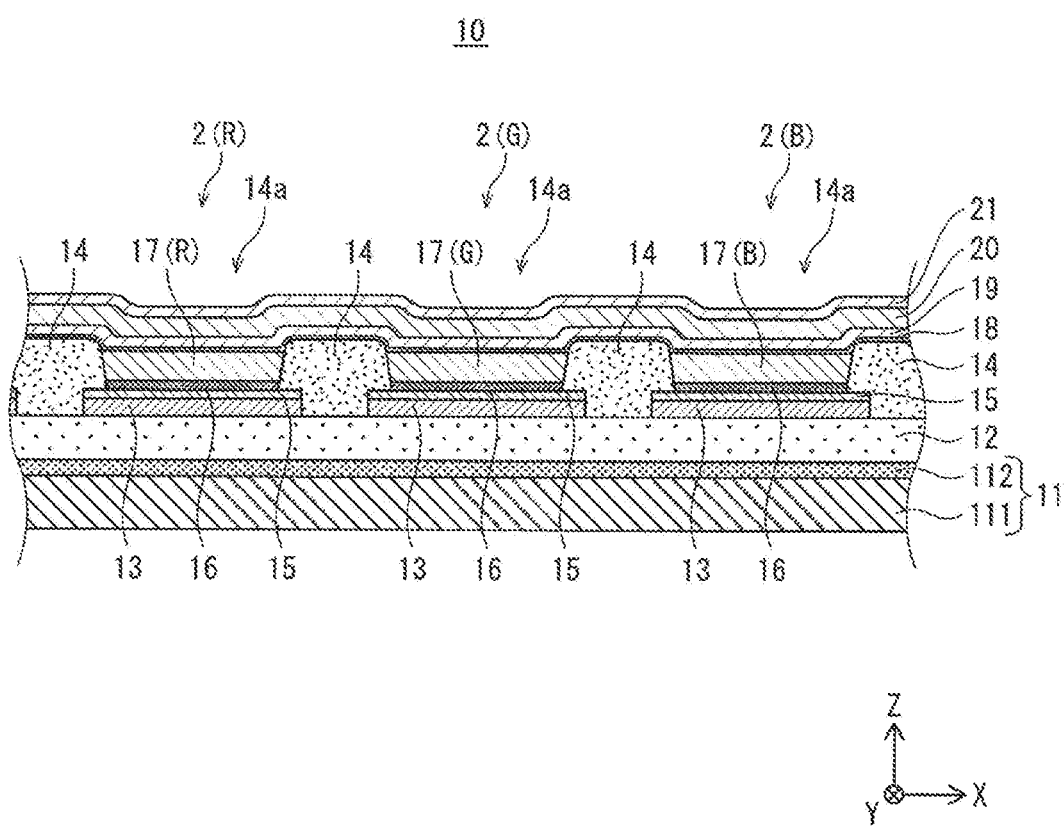
FIG. 3 is a schematic sectional view taken along line A-A of FIG. 2.

FIG. 3 is a schematic sectional view taken along line A-A of FIG. 2.

In the organic EL panel 10, one pixel includes three respective sub-pixels that emit light in R, G and B, and each of the sub-pixels includes the organic EL element 2(R), 2(G) or 2(B) that emit light in the corresponding color.

The organic EL elements 2(R), 2(G) and 2(B) corresponding to the respective light emission colors basically have substantially the same configurations; when they are not discriminated, therefore, they will each be described as the organic EL element 2.

As depicted in FIG. 3, the organic EL element 2 includes a substrate 11, an interlayer insulating layer 12, a pixel electrode (anode) 13, the partition wall 14, a hole injection layer 15, a hole transport layer 16, an organic light emitting layer 17, a functional layer 18, an IZO film 19, a counter electrode (cathode) 20, and a sealing layer 21.

The substrate 11, the interlayer insulating layer 12, the functional layer 18, the IZO film 19, the counter electrode 20 and the sealing layer 21 are not formed on a pixel basis, but are formed in common for the plurality of organic EL elements 2 possessed by the organic EL panel 10.

(1) Substrate

The substrate 11 includes a base material 111 which is an insulating material, and a TFT layer 112. The TFT layer 112 is formed with driving circuits on a sub-pixel basis. As the base material 111, there can be adopted, for example, glass substrate, quartz substrate, silicon substrate, metallic substrates of molybdenum sulfide, copper, zinc, aluminum, stainless steel, magnesium, iron, nickel, gold, silver and the like, semiconductor substrates of gallium arsenide and the like, and plastic substrates.

As the plastic material, any one of thermoplastic resins and thermosetting resins may be used. Examples of the applicable resin include polyethylene, polypropylene, polyamides, polyimides (PI), polycarbonate, acrylic resins, polyethylene terephthalate (PET), polybutylene terephthalate, polyacetal, other fluororesins, various thermoplastic elastomers based on styrene, polyolefin, polyvinyl chloride, polyurethane, fluororubber, chlorinated polyethylene or the like, epoxy resin, unsaturated polyesters, silicone resins, polyurethane, and copolymers, blends, polymer alloys and the like of them, and stacked bodies of one or more of them.

(2) Interlayer Insulating Layer

The interlayer insulating layer 12 is formed over the substrate 11. The interlayer insulating layer 12 is formed using a resin material, and is for flattening steps present in an upper surface of the TFT layer 112. As the resin material, a positive-type photosensitive material may be mentioned, for example. Examples of such a photosensitive material include acrylic resins, polyimide resins, siloxane resins, and phenolic resins. In addition, though not depicted in the sectional view of FIG. 3, the interlayer insulating layer 12 is formed with contact holes on a sub-pixel basis.

(3) Pixel Electrode

The pixel electrodes 13 each include a metallic layer formed using a light-reflective metallic material, and are formed over the interlayer insulating layer 12. The pixel electrodes 13 are provided on a sub-pixel basis, and are each electrically connected to the TFT layer 112 through the contact hole (not illustrated).

In the present embodiment, the pixel electrode 13 functions as an anode.

Specific examples of the metallic material having a light-reflecting property include Ag (silver), Al (aluminum), aluminum alloys, Mo (molybdenum), APC (an alloy of silver, palladium and copper), ARA (an alloy of silver, rubidium and gold), MoCr (an alloy of molybdenum and chromium), MoW (an alloy of molybdenum and tungsten), and NiCr (an alloy of nickel and chromium).

While the pixel electrode 13 may include a metallic layer alone, it may have a stacked structure in which a layer of a metallic oxide such as ITO (indium tin oxide) or IZO (indium zinc oxide) is stacked over a metallic layer.

(4) Partition Wall and Pixel Restricting Layer

The partition walls 14 are for partitioning the plurality of pixel electrodes 13, which are disposed on a sub-pixel basis on the upper side of the substrate 11, from one another on a column basis in the X direction (see FIG. 2), and are in a line bank shape in which they extend in the Y direction between the sub-pixel columns CR, CG and CB aligned in the X direction.

For the partition walls 14, an electrically insulating material is used. Specific examples of the electrically insulating material to be used include insulating organic materials (e.g., acrylic resins, polyimide resins, novolak resins, phenolic resins, etc.).

The partition walls 14 function as structures for preventing color inks, which are applied in the case of forming the organic light emitting layers 17 by a coating (applying) method, from overflowing and mixing with one another.

Note that in the case of using a resin material, it is preferable that the resin material is photosensitive, from the viewpoint of processability. The photosensitive property may be either of the positive type and the negative type.

The partition walls 14 preferably have resistance to organic solvents and heat. In addition, the surfaces of the partition walls 14 preferably have a predetermined liquid repellency, for restraining the inks from flowing out.

At parts where the pixel electrode 13 is not formed, bottom surfaces of the partition walls 14 are in contact with the upper surface of the interlayer insulating layer 12.

The pixel restricting layers 141 are formed using an electrically insulating material, cover end portions of the pixel electrodes 13 adjacent to each other in the Y direction (FIG. 2) in each sub-pixel column, and partition the pixel electrodes 13 adjacent to each other in the Y direction from one another.

The film thickness of the pixel restricting layers 141 is set to be slightly greater than the film thickness of the pixel electrodes 13 but be smaller than the thickness to the upper surface of the organic light emitting layers 17. This ensures that the organic light emitting layers 17 in the sub-pixel columns CR, CG and CB are not partitioned by the pixel restricting layers 141, so that flow of inks at the time of forming the organic light emitting layers 17 is not obstructed. Therefore, it is made easy to uniformize the thickness of the organic light emitting layer 17 in each of the sub-pixel columns.

The pixel restricting layers 141, with the above-mentioned structure, play the roles of restraining step-cut of the organic light emitting layer 17 in each of the sub-pixel columns CR, CG and CB, enhancing the electrical insulation between the pixel electrodes 13 and the counter electrode 20, and the like while enhancing the electrical insulation between the pixel electrodes 13 adjacent to each other in the Y direction.

Specific examples of the electrical insulating material to be used for the pixel restricting layers 141 include the resin materials and inorganic materials mentioned above as examples of the material for the partition walls 14. In addition, for easy wetting and spreading of inks at the time of forming the organic light emitting layers 17 as upper layers, it is preferable that the surfaces of the pixel restricting layers 141 have a liophilic property for the inks.

(5) Hole Injection Layer

The hole injection layer 15 is provided over the pixel electrode 13 for the purpose of accelerating the injection of holes from the pixel electrode 13 into the organic light emitting layer 17. The hole injection layers 15 are layers of, for example, an oxide of Ag (silver), Mo (molybdenum), Cr (chromium), V (vanadium), W (tungsten), Ni (nickel), Ir (iridium) or the like, or a conductive polymer material such as PEDOT (a mixture of polythiophene and polystyrenesulfonic acid). The hole injection layers 15 may be formed by, for example, a sputtering process or a wet process. In addition, for example, a conductive polymer material such as PEDOT (a mixture of polythiophene and polystyrenesulfonic acid) may be stacked over an oxide of Ag (silver), Mo (molybdenum), Cr (chromium), V (vanadium), W (tungsten), Ni (nickel), Ir (iridium) or the like.

Of the above-mentioned, the hole injection layers 15 formed using an oxidized metal have a function of stably generating holes or assisting generation of holes and thereby injecting the holes into the organic light emitting layers 17, and have a great work function.

(6) Hole Transport Layer

The hole transport layer 16 has a function of transporting the holes, injected from the hole injection layer 15, to the organic light emitting layer 17. The hole transport layers 16 are formed, for example, by a wet process using a material which is a polyolefin or its derivative or a polyarylamine or its derivative or the like and which does not have a hydrophilic group.

(7) Organic Light Emitting Layer

The organic light emitting layers 17 are formed in openings 14a, and have functions of emitting light in colors of R, G and B, through recombination of holes and electrons. Note that particularly when it is necessary to make a description while specifying the light emission color, the organic light emitting layers 17 will be referred to as organic light emitting layers 17(R), 17(G) and 17(B), respectively.

As materials for the organic light emitting layers 17, known materials can be used. Specific examples of the material to be preferably used here include fluorescent substances such as oxinoid compounds, perylene compounds, coumarin compounds, azacoumarin compounds, oxazole compounds, oxadiazole compounds, perinone compounds, pyrrolopyrrole compounds, naphthalene compounds, anthracene compounds, fluorene compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compound, thiapyrylium compounds, selenapyrylium compounds, telluropyrylium compounds, aromatic aldadiene compounds, oligophenylene compounds, thioxanthene compounds, cyanine compounds, acridine compounds, metal complexes of 8-hydroxyquinoline compounds, metal complexes of 2-bipyridine compounds, complexes of Schiff base and Group III metals, oxine metal complexes, and rare earth complexes.

(8) Functional Layer

The functional layer 18 has a function of injecting or transporting the electrons, supplied from the counter electrode 20, to the organic light emitting layer 17 side.

The functional layer 18 is formed using a mixture of a fluoride of an alkaline metal and a rare earth metal, in which part of the rare earth metal is present in an oxidized state.

The fluoride of an alkaline metal is low in moisture transmittance and has a waterproofing property. In addition, the rare earth metal is a metal having a low work function, is excellent in an electron injecting property, and is low in reactivity with moisture, and, further, its oxide is high in transparency.

Therefore, the functional layer 18 formed using a mixture of them has a water-proofing property and has both good electron injecting property and transparency, resulting in that large enhancement of luminous efficiency can be expected.

In addition, those metals of the rare earth metals which are highly reducing, such as Yb, have an effect to reduce the fluoride of an alkaline metal to dissociate the alkaline metal, whereby an effect to further enhance the electron transporting property can be obtained.

In the present embodiment, NaF (sodium fluoride) is adopted as the fluoride of an alkaline metal, and Yb (ytterbium) is adopted as the rare earth metal.

(9) IZO Film

The IZO film 19 is a transparent conductive film, acts as a cathode of a two-layer structure together with the counter electrode 20, and plays the role of oxidizing part of Yb in the functional layer 18 at the time of formation thereof.

Note that since the IZO film is excellent in light transmittance, it is possible, by regulating the film thickness thereof, to control the distance from the organic light emitting layer 17 to the counter electrode 20, thereby contributing to constructing a higher order optical resonator. This will be described in detail later.

(10) Counter Electrode

The counter electrode 20 is formed over the IZO film 19, and functions as a cathode.

Since the organic EL panel 10 according to the present embodiment is of the top emission type, the counter electrode 20 should be both light-transmitting and conductive. In the present embodiment, a metallic thin film of silver, a silver alloy, aluminum, an aluminum alloy or the like is used as the material of the counter electrode 20, for obtaining an optical resonator structure more effectively. The film thickness of the counter electrode 20 is desirably 5 to 50 nm.

(11) Sealing Layer

The sealing layer 21 is provided for preventing the organic layers such as the hole transport layers 16, the organic light emitting layers 17 and the IZO film 19 from being deteriorated due to exposure to moisture or air.

The sealing layer 21 is formed by using a light transmitting material such as silicon nitride (SiN) and silicon oxynitride (SiON), for example.

(12) Others

Though not depicted in FIG. 3, an anti-glare polarizing plate or an upper substrate may be adhered onto the sealing layer 21 through a transparent adhesive. In addition, color filters for correcting chromaticity of light emitted by each of the organic EL elements 2 may be adhered. By these members, it is possible to further protect the hole transport layers 16, the organic light emitting layers 17, the functional layers 18 and the like from external moisture, air and the like.

3. Method of Manufacturing Organic EL Panel 10

A method of manufacturing the organic EL panel 10 will be described below, referring to the drawings.

FIGS. 4A to 4E, FIGS. 5A to 5D, and FIGS. 7A to 7D are schematic sectional views depicting the states in steps in manufacturing the organic EL panel 10. Besides, FIG. 8 is a flow chart depicting the manufacturing steps of the organic EL panel 10.

(1) Substrate Preparing Step

Figure 4A:
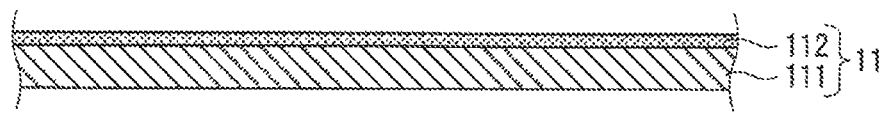
FIGS. 4A to 4E are partial sectional views schematically depicting a manufacturing process of an organic EL element.
Figure 8:
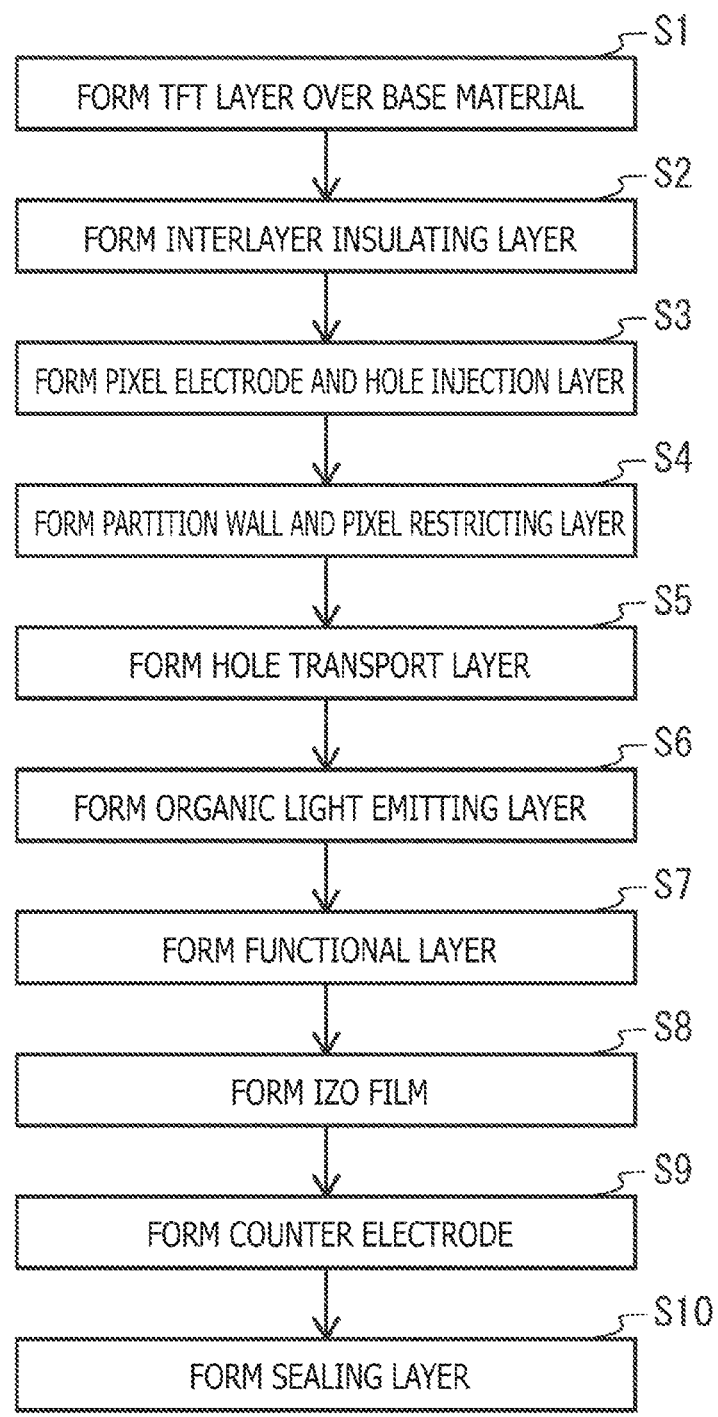
FIG. 8 is a flow chart depicting the manufacturing process of the organic EL element.

First, as illustrated in FIG. 4A, the TFT layer 112 is formed over the base material 111, to prepare the substrate 11 (step S1 in FIG. 8). The TFT layer 112 can be formed by a known TFT producing method.

(2) Interlayer Insulating Layer Forming Step

Figure 4B:
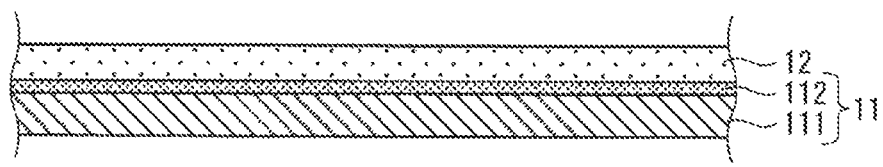

Next, as depicted in FIG. 4B, the interlayer insulating layer 12 is formed over the substrate 11 (step S2 in FIG. 8).

Specifically, a resin material having a predetermined flowing property is applied along the upper surface of the substrate 11 in such a manner as to bury the ruggedness (projections and recesses) formed on the substrate 11 due to the TFT layer 112, by a die coating method, for example. As a result, the upper surface of the interlayer insulating layer 12 is shaped to be flat along the upper surface of the base material 111.

In addition, a dry etching method is applied to those parts of the interlayer insulating layer 12 which are located over, for example, source electrodes of TFT elements, to form the contact holes (not illustrated). The contact holes are formed, by patterning or the like, in such a manner that the surfaces of the source electrodes are exposed at bottom portions thereof.

Subsequently, connection electrode layers are formed along inner walls of the contact holes. Of upper portions of the connection electrode layers, parts are disposed over the interlayer insulating layer 12. The connection electrode layers can be formed by using, for example, a sputtering method; specifically, after a metallic film is formed, patterning may be conducted using a photolithography method and a wet etching method.

(3) Pixel Electrode and Hole Injection Layer Forming Step

Figure 4C:
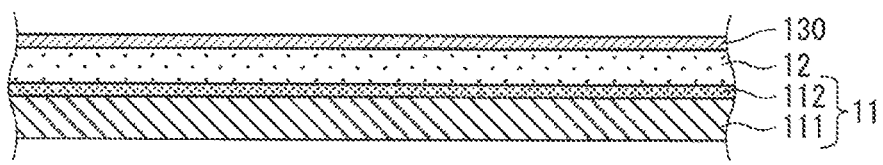

Next, as illustrated in FIG. 4C, a pixel electrode material layer 130 is formed over the interlayer insulating layer 12. The pixel electrode material layer 130 can be formed by using, for example, a vacuum deposition method, a sputtering method or the like.

Figure 4D:
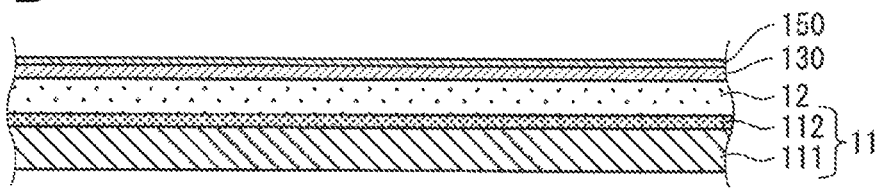

Further, a hole injection material layer 150 is formed over the pixel electrode material layer 130 (FIG. 4D). The hole injection material layer 150 can be formed by using, for example, a reactive sputtering method or the like.

Figure 4E:
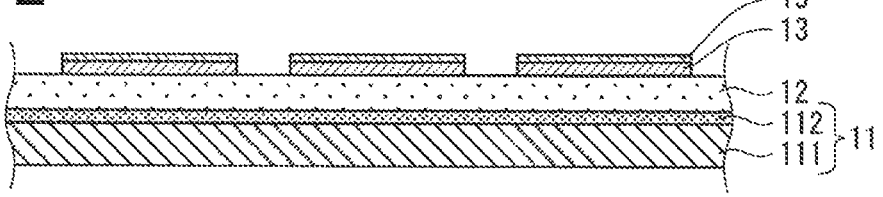

Then, as depicted in FIG. 4E, the pixel electrode material layer 130 and the hole injection material layer 150 are patterned by etching, to form pluralities of pixel electrodes 13 and hole injection layers 15 partitioned on a sub-pixel basis (step S3 in FIG. 8).

Note that the method for forming the pixel electrodes 13 and the hole injection layers 15 is not limited to the aforementioned method. For example, the pixel electrode material layer 130 may be patterned to form the pixel electrodes 13, after which the hole injection layers 15 may be formed.

In addition, the hole injection layers 15 may be formed by a wet process, after the partition walls 14 are formed.

(4) Partition Wall and Pixel Restricting Layer Forming Step

Subsequently, the partition walls 14 and the pixel restricting layers 141 are formed (step S4 in FIG. 8).

In the present embodiment, the pixel restricting layers 141 and the partition walls 14 are formed in separate steps.

(4-1) Pixel Restricting Layer Formation

First, in order to partition the pixel electrode columns in the Y direction (FIG. 2) on a sub-pixel basis, the pixel restricting layers 141 extending in the X direction are formed.

Figure 5A:
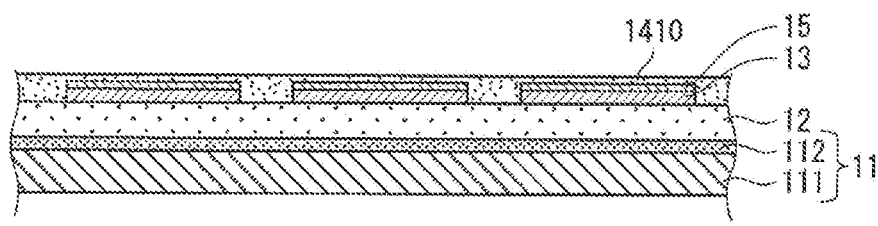
FIGS. 5A to 5D are partial sectional views schematically depicting the manufacturing process of the organic EL element subsequent to FIGS. 4A to 4E.

As depicted in FIG. 5A, a photosensitive resin material as a material for the pixel restricting layers 141 is uniformly applied over the interlayer insulating layer 12 formed with the pixel electrodes 13 and the hole injection layers 15, to form a pixel restricting layer material layer 1410 having a film thickness equal to the height of the pixel restricting layers 141 to be formed.

As a specific coating (applying) method, there can be used, for example, a wet process such as a die coating method and a spin coating method. After the coating (application), it is preferable to perform, for example, vacuum drying and low-temperature heating drying (pre-baking) at approximately 60° C. to 120° C. to remove the unrequired solvent, thereby fixing the pixel restricting layer material layer 1410 to the interlayer insulating layer 12.

Then, the pixel restricting layer material layer 1410 is patterned by use of a photolithography method.

For example, in the case where the pixel restricting layer material layer 1410 has a positive-type photosensitive property, the pixel restricting layer material layer 1410 is exposed to light through a photomask (not illustrated) which shields light in areas where the layer 1410 is to be left as the pixel restricting layers 141 and which is transparent in areas where the layer 1410 is to be removed.

Next, development is conducted to remove the exposed regions of the pixel restricting layer material layer 1410, whereby the pixel restricting layers 141 can be formed. A specific developing method may include, for example, immersing the substrate 11 as a whole in a developing liquid such as an organic solvent or an alkaline liquid for dissolving the exposed parts of the pixel restricting layer material layer 1410, followed by cleaning the substrate 11 with a rinsing liquid such as pure water.

Figure 5B:
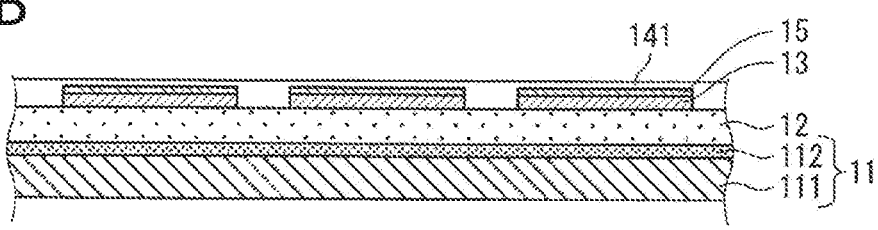

Thereafter, baking (post-baking) is conducted at a predetermined temperature, whereby the pixel restricting layers 141 extending in the X direction can be formed over the interlayer insulating layer 12 (FIG. 5B).

(4-2) Partition Wall Formation

Subsequently, the partition walls 14 extending in the Y direction are formed similarly to the pixel restricting layers 141.

Figure 5C:
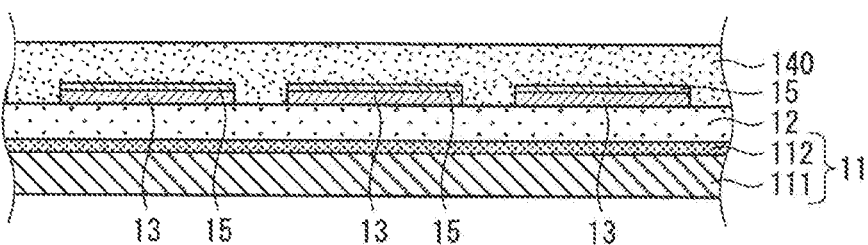
Figure 5D:
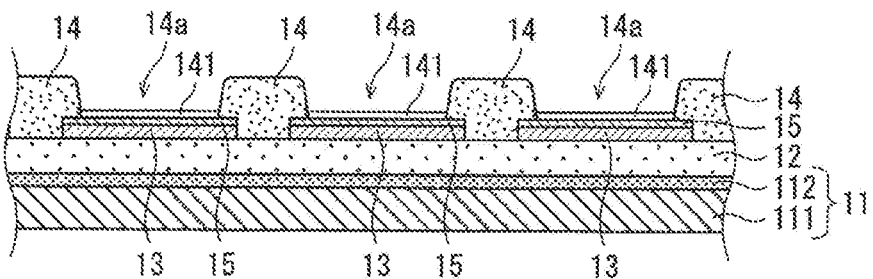

Specifically, a resin material for the partition walls is applied over the interlayer insulating layer 12 formed with the pixel electrodes 13, the hole injection layers 15 and the pixel restricting layers 141, by use of a die coating method or the like, to form a partition wall material layer 140 having a film thickness equal to the height of the partition walls 14 to be formed (FIG. 5C), then the partition walls 14 extending in the Y direction are patterned in the partition wall material layer 140 by a photolithography method, and thereafter baking is conducted at a predetermined temperature to form the partition walls 14 (FIG. 5D).

Note that while patterning is conducted after the respective material layers of the pixel restricting layers 141 and the partition walls 14 are formed by a wet process in the foregoing, one or both of the material layers may be formed by a dry process and then patterning may be performed by a photolithography method and an etching method.

(5) Hole Transport Layer Forming Step

Figure 6A:
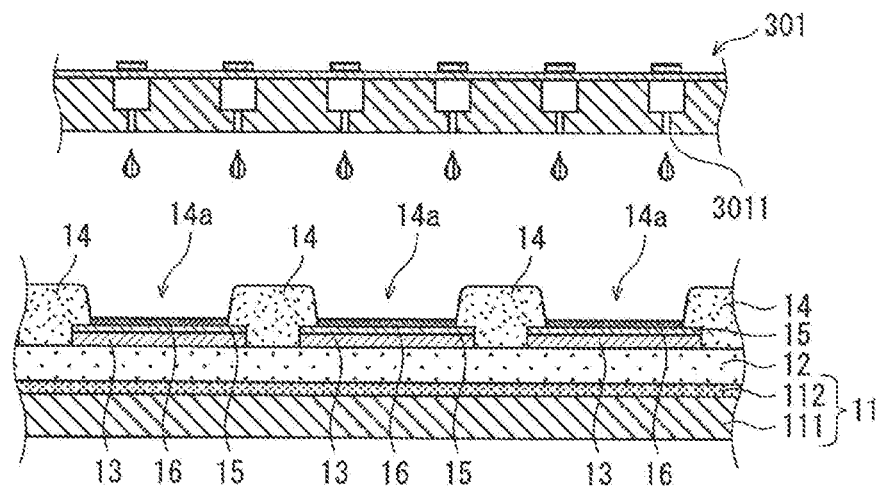
FIGS. 6A and 6B are partial sectional views schematically depicting the manufacturing process of the organic EL element subsequent to FIGS. 5A to 5D.

Next, as depicted in FIG. 6A, an ink containing a constituent material of the hole transport layers 16 is ejected from nozzles 3011 of a coating (applying) head 301 of a printing device toward the openings 14a defined by the partition walls 14, to apply the ink onto the hole injection layers 15 in the openings 14a. In this instance, the ink for the hole transport layers 16 is applied in such a manner as to extend in the Y direction (FIG. 2) on an upper side of the pixel electrode columns. Thereafter, the ink is dried, to form the hole transport layers 16 (step S5 in FIG. 8).

(6) Organic Light Emitting Layer Forming Step

Subsequently, the organic light emitting layers 17 are formed on an upper side of the hole transport layers 16 (step S6 in FIG. 8).

Figure 6B:
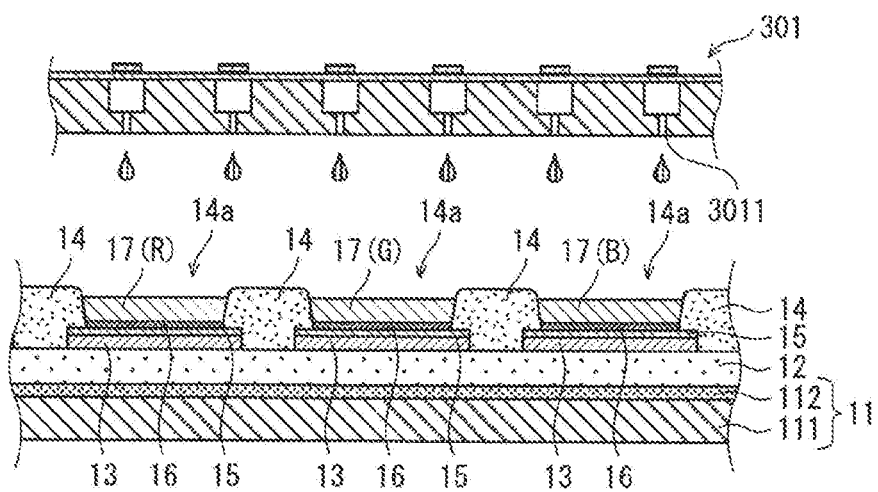

Specifically, as depicted in FIG. 6B, the inks containing light emitting materials for light emission colors corresponding to the openings 14a are sequentially ejected from the nozzles 3011 of the coating (applying) head 301 of the printing device, to apply the inks onto the hole transport layers 16 in the openings 14a. In this instance, the inks are applied in such a manner as to be continuous on the upper side of the pixel restricting layers 141. As a result, the inks can flow in the Y direction, so that unevenness in application of the inks can be reduced, and the film thickness of the organic light emitting layers 17 in the same sub-pixel column can be uniformized.

Then, the substrate 11 after the ink application is carried into a vacuum drying chamber and is heated in a vacuum environment, to evaporate off the organic solvents in the inks. By this, the organic light emitting layers 17 can be formed.

(7) Functional Layer Forming Step (Functional Layer Precursor Forming Step)

Figure 7A:
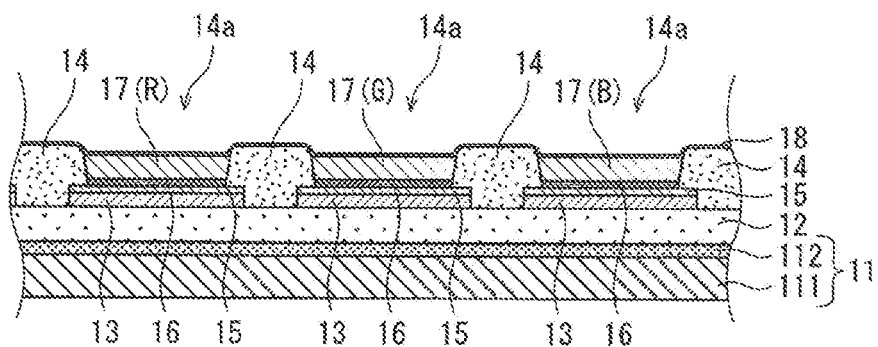
FIGS. 7A to 7D are partial sectional views schematically depicting the manufacturing process of the organic EL element subsequent to FIGS. 6A and 6B.

Next, as depicted in FIG. 7A, a functional layer precursor 181 is formed over the organic light emitting layers 17 and the partition walls 14 (step S7 in FIG. 8). The functional layer precursor 181 is formed by forming a film of NaF and Yb in a predetermined ratio by a vapor co-deposition method.

(8) IZO Film Forming Step

Figure 7B:
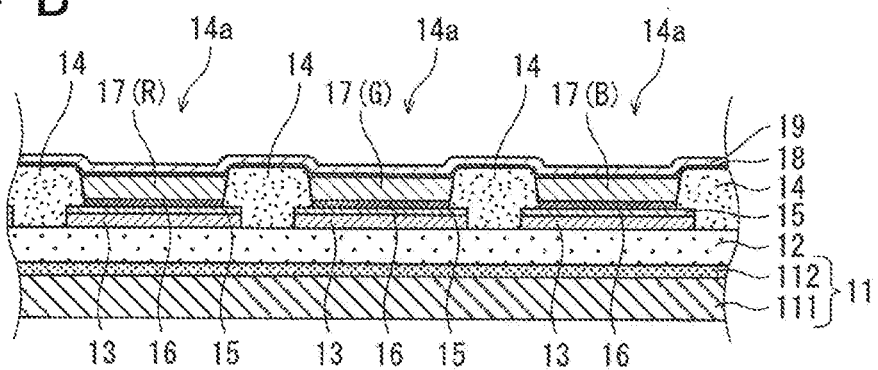

Subsequently, the IZO film 19 is formed over the functional layer precursor 181 (FIG. 7B; step S8 in FIG. 8). The IZO film 19 is formed by sputtering IZO.

Note that at the time of this sputtering, particulates of IZO erode from the surface of the functional layer precursor 181, whereby part of Yb on the IZO film 19 side in the functional layer precursor 181 is oxidized in a layer form in a predetermined thickness, and the functional layer 18 is finally formed.

Note that the film thickness of the IZO film 19 is desirably not less than 15 nm, and, in the case of constructing an optical resonator structure which will be described later, the film thickness is desirably not less than 40 nm.

(9) Counter Electrode Forming Step

Figure 7C:
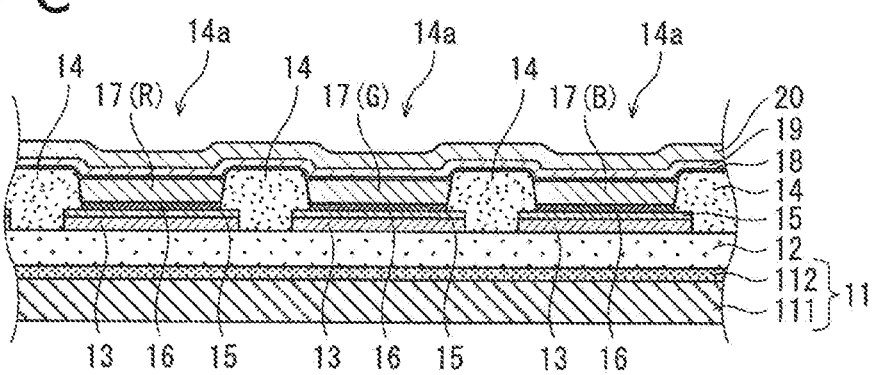

Next, as depicted in FIG. 7C, the counter electrode 20 is formed over the IZO film 19 (step S9 in FIG. 8). In the present embodiment, the counter electrode 20 is formed by forming a film of silver, aluminum or the like by a sputtering method of a vacuum deposition method.

(10) Sealing Layer Forming Step

Figure 7D:
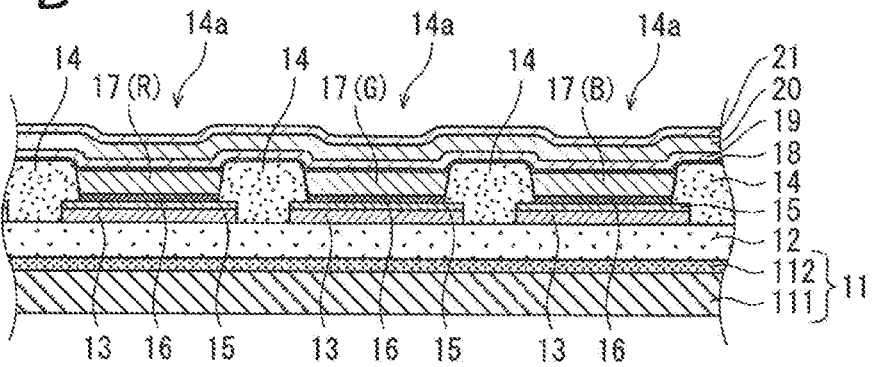

Subsequently, as illustrated in FIG. 7D, the sealing layer 21 is formed over the counter electrode 20 (step S10 in FIG. 8). The sealing layer 21 can be formed by forming a film of SiON, SiN or the like by a sputtering method, a CVD (chemical vapor deposition) method or the like.

By these steps, the organic EL panel 10 is completed.

Note that the above-mentioned manufacturing method is merely an example, and various modifications are possible according to the gist of the present disclosure.

4. Evaluation Experiment of Organic EL Element

Evaluation experiments were conducted with respect to transmittance and driving voltage between the organic light emitting layer 17 and the counter electrode 20 as indexes indicating the goodness of luminous efficiency of the organic EL element 2 formed by the present embodiment.

(1) Evaluation Experiment as to Transmittance

Figure 9:
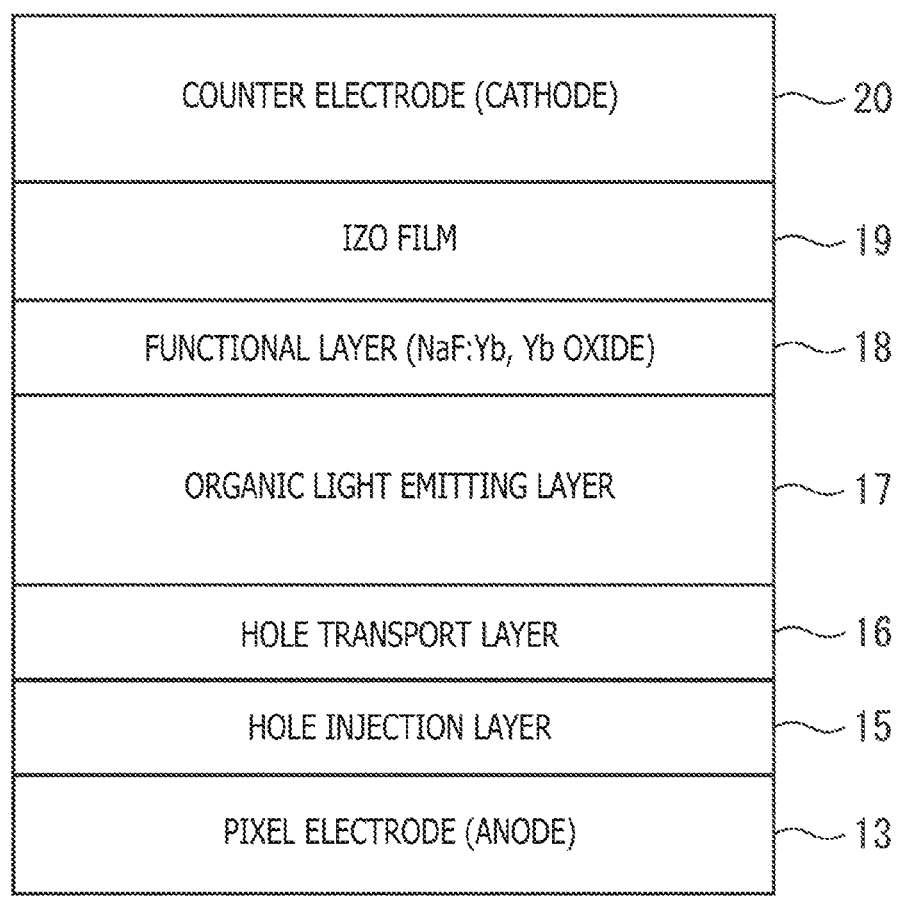
FIG. 9 is a figure schematically depicting a stacked structure of the organic EL element according to a mode of the present disclosure.

FIG. 9 is a figure schematically depicting a stacked structure ranging from the pixel electrode (anode) 13 to the counter electrode (cathode) 20 in the above-mentioned organic EL element 2. As depicted in the figure, in the organic EL element 2 (working example product), an Al alloy is vapor deposited on a glass substrate to form the pixel electrode (anode) 13, and the hole injection layer 15, the hole transport layer 16, the organic light emitting layer 17, the functional layer 18, the IZO film 19 and the counter electrode (cathode) 20 are sequentially stacked thereover.

As aforementioned, the functional layer 18 is formed by first co-depositing NaF and Yb on the organic light emitting layer 17 to form a layer of a mixture of NaF and Yb (hereinafter referred to as "NaF:Yb layer"), and the IZO film 19 is formed thereon by a sputtering method. In this case, it is surmised that part of Yb in the NaF:Yb layer is oxidized in a layer form parallel to the main surface of the NaF:Yb layer.

Specifically, as a sample of the working example product for evaluation of transmittance of the organic EL element 2 according to the present embodiment, a product in which the functional layer 18 and the IZO film 19 were formed over a glass substrate was used (H14). In evaluation of luminous efficiency, the total transmittance of these two layers contributes most.

Note that in the present experiment, the proportion (wt %) of the weight of Yb based on the total weight of NaF and Yb was set to 80 wt %. In addition, the thickness of the functional layer 18 is 15 nm.

For comparative experiments, the following three comparative example products were formed.

A first comparative example product is a product in which the functional layer 18 of the working example product was formed only of NaF in a film thickness of 15 nm (H11).

A second comparative example product is a product in which the functional layer 18 of the working example product was formed only of Yb in a film thickness of 15 nm (H12).

A third comparative example product is a product in which the functional layer 18 of the working example product was in a two-layer structure, including a first layer on the organic light emitting layer 17 side which was formed only of NaF, and a second layer thereon which was formed only of Yb (hereinafter referred to as "NaF/Yb layer") (H13). The total film thickness of the first layer and the second layer was 15 nm, and the film thicknesses of the first layer and the second layer were set in such a manner that the amount of Yb in the two layers was 80 wt %, the same as in the working example product.

In every case, the film thickness of the IZO film was set to 5 nm in a unifying manner.

Measurement of transmittance was conducted using a visible-near infrared spectrophotometer SolidSpec-3700 produced by Shimadzu Corporation. First, transmittance of the glass substrate alone was measured, and, with this as a base line, a sample having the functional layer formed on the glass substrate was subjected to measurement, to calculate the transmittance.

In the experiment of transmittance, a visible-ray illumination device was disposed on the lower side of the experiment target product, whereas an illuminance sensor was disposed on the upper side, and a relative value of the value detected for the experiment target product by the illuminance sensor based on a reference value which is the value detected for the glass substrate alone by the illuminance sensor was determined as the transmittance.

Figure 10:
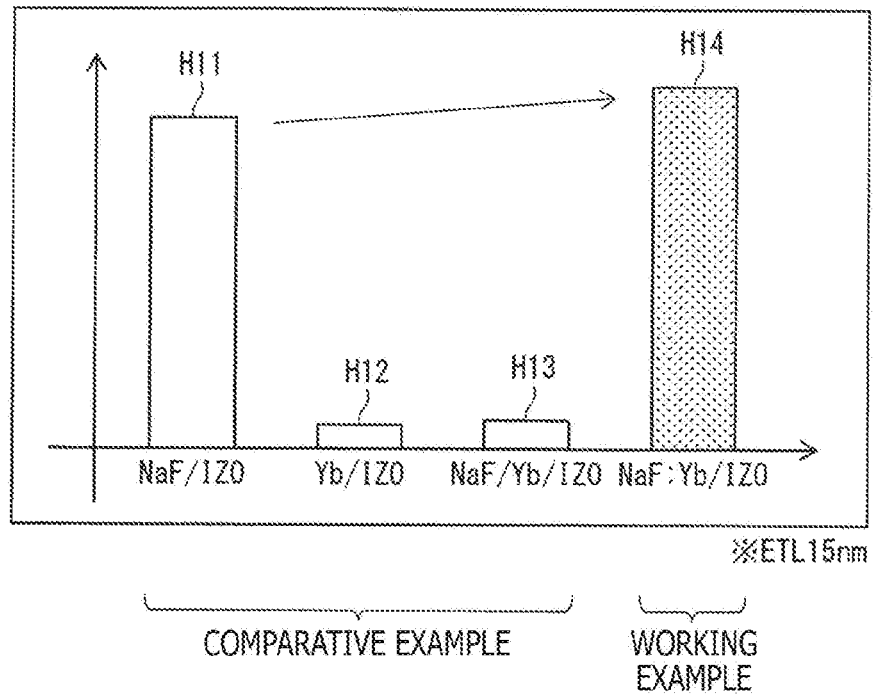
FIG. 10 is a graph depicting the results of a comparative experiment of transmittance for verifying the effect of the organic EL element according to the mode of the present disclosure.

FIG. 10 is a graph depicting the evaluation of the transmittance experiment, in which the axis of ordinates represents a relative value based on the above-mentioned reference value.

As illustrated in the graph, the working example product (H14) was the most excellent in transmittance, the first comparative example product (H11) was slightly lower, and the second comparative example product (H12) and the third comparative example product (H13) were considerably low in transmittance.

The transmittance of the first comparative example product is high because the transparency of NaF itself is high. The transmittance of the second comparative example product is low because the transmittance of Yb is low. The transmittance of the third comparative example product is slightly improved as compared to the transmittance of the second comparative example product, because the layer of NaF is included.

However, though containing the same NaF and Yb similarly, the working example product (H14) formed by vapor co-deposition is remarkably better in transmittance than the third comparative example product, which is interpreted to be for the following reasons.

Specifically, the rare earth metals such as Yb have a characteristic of being enhanced in transparency when oxidized. On the other hand, even when a rare earth metal alone is oxidized, an oxide (passive state) is formed only at the surface of the rare earth metal alone, and Yb atoms in an inner layer on the inner side of the surface are not oxidized since they are blocked by the oxide densely formed at the surface of the rare earth metal. Therefore, in the second and third comparative example products, an oxide film is formed only at the surface of the Yb layer, oxygen does not penetrate to the inside, and it is difficult to oxidize a deep layer, so that improvement in transmittance is hardly expected.

In contrast, in the working example product (H14), NaF and Yb are co-deposited, so that Yb atoms and NaF molecules are present as a mixture in the state of being dispersed mutually. Therefore, gaps are present between the Yb atoms (or between clusters of Yb). When IZO is sputtered thereon, not only the Yb atoms present at the surface are oxidized, but also IZO penetrates via the gaps between the Yb atoms, whereby the Yb atoms in the inside can be sequentially oxidized. As a result, the Yb atoms present at considerable depths in the film thickness direction can be oxidized, and, accordingly, transmittance is enhanced remarkably.

Since NaF itself is originally high in transmittance (see H11) and the oxide of Yb is further higher in transmittance, it is considered that the working example product (H14) surpasses the first comparative example product (H11) in transmittance and becomes the highest in transmittance.

(2) Evaluation Experiment as to Driving Voltage

In the next place, an evaluation experiment as to driving voltage was conducted.

A working example product (H24) is a product in which the hole transport layer 16 in the stacked structure of FIG. 9 was omitted, and the functional layer 18 was a NaF:Yb layer containing 80 wt % of Yb with a film thickness of 15 nm.

As comparative example products, organic EL elements of the following configurations were formed.

A first comparative example product (H21) is a product in which the functional layer 18 in the working example product was formed only of NaF in a film thickness of 15 nm.

A second comparative example product (H22) is a product in which the functional layer 18 in the working example product was formed only of Yb in a film thickness of 15 nm.

A third comparative example product (H23) is a product in which the functional layer 18 in the working example product was of a two-layer structure, in which a first layer on the organic light emitting layer 17 side was formed only of NaF, and a second layer was formed only of Yb. The total film thickness of the first layer and the second layer was 15 nm, and the film thicknesses of the first layer and the second layer were set in such a manner that the amount of Yb based on the two layers as a whole was 80 wt %, the same as in the working example product.

The other conditions for the comparative example products are the same as those for the working example product.

Figure 11:
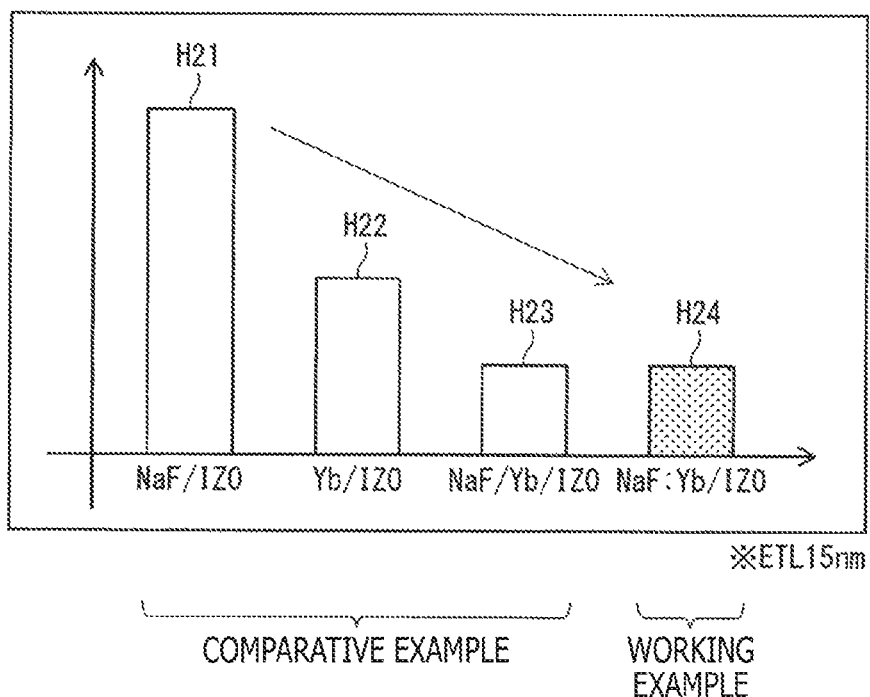
FIG. 11 is a graph depicting the results of a comparative experiment of driving voltage for verifying the effect of the organic EL element according to the mode of the present disclosure.

FIG. 11 is a graph depicting the experimental results of driving voltage for the comparative example products and the working example product. A voltage value when a predetermined current was applied to the anode and the cathode of each of the experiment target products was measured.

As indicated in the graph in the figure, the driving voltage was sequentially lowered from the first comparative example product (H21) to the third comparative example product (H23), and the working example product (H24) was substantially comparable to the third comparative example product (H23) in driving voltage.

Such a result may be considered to be for the following reasons. Where the functional layer 18 was NaF alone (H21), NaF was not dissociated but was present as it was an insulating layer, and the energy barrier between the cathode and the organic light emitting layer could not be dissolved sufficiently, so that the electron injecting property was low. In addition, where the functional layer 18 was Yb alone, since Yb is higher than NaF in electron injecting property, the driving voltage is slightly lowered. Further, NaF/Yb and NaF:Yb could sequentially lower the energy barrier by NaF and Yb, whereby the electron injecting property or the electron transporting property could be enhanced, and for this reason, the comparable low driving voltages resulted.

As aforementioned, it is important, in evaluating luminous efficiency, that transmittance is high and driving voltage is low. Therefore, the experimental results indicated in FIGS. 10 and 11 verify that an effect to enhance luminous efficiency can be obtained with the working example products.

5. Co-Deposition Ratio of NaF:Yb in Functional Layer

The functional layer is formed by vapor co-deposition of NaF:Yb as aforementioned, and the IZO film is formed as an overlying layer, whereby an excellent effect as follows can be obtained as compared to the configuration disclosed in Patent Document 1.

(a) According to the embodiment of the present disclosure, since NaF is a fluoride of an alkaline metal and is excellent in moisture blocking property and light transmitting property, and since vapor co-deposition of NaF with Yb which has reducing property dissociates part of NaF into Na and provides an electron transporting property, a prolonged life and a high luminous efficiency can be obtained, while reducing production cost by forming the organic light emitting layers by a wet process.

(b) In addition, in the case where an organic material doped with an alkaline metal is stacked as an overlying layer for an intermediate layer (NaF) as in Patent Document 1, reducing property is lowered as compared to the case where only the alkaline metal is stacked; therefore, when the film thickness of the intermediate layer is increased, an increased in driving voltage is further enlarged, and it may be impossible to sufficiently achieve the object to enhance luminous efficiency. According to the configuration of the embodiment of the present disclosure, however, NaF and Yb are present mixedly in the same functional layer due to the vapor co-deposition; therefore, electron transporting property is not liable to be lowered even when the thickness is enlarged to a certain extent, so that the functional layer can play the role of an adjusting layer for adjusting the optical distances in an optical resonator structure. This eliminate the need for providing other special film thickness adjusting layer. Therefore, the manufacturing process is simplified as compared to the case of Patent Document 1, and it is possible to construct an optical resonator structure and realize an enhanced luminous efficiency while reducing the production cost.

Now, in what range the proportion of the weight of Yb based on the total weight of NaF and Yb (wt %; hereinafter referred to simply as the "co-deposition ratio") in the NaF:Yb layer of the functional layer 18 should be set for making it possible to obtain a further enhanced luminous efficiency will be discussed below.

As aforementioned, it is considered that for enlarging the thickness of the layer of the oxide of Yb in the functional layer 18, it is necessary that NaF should be dispersed between the atoms (or clusters) of Yb and that IZO, particularly oxygen atoms O, should penetrate from there into the inside of the functional layer 18 at the time of sputtering of IZO.

Figure 12:
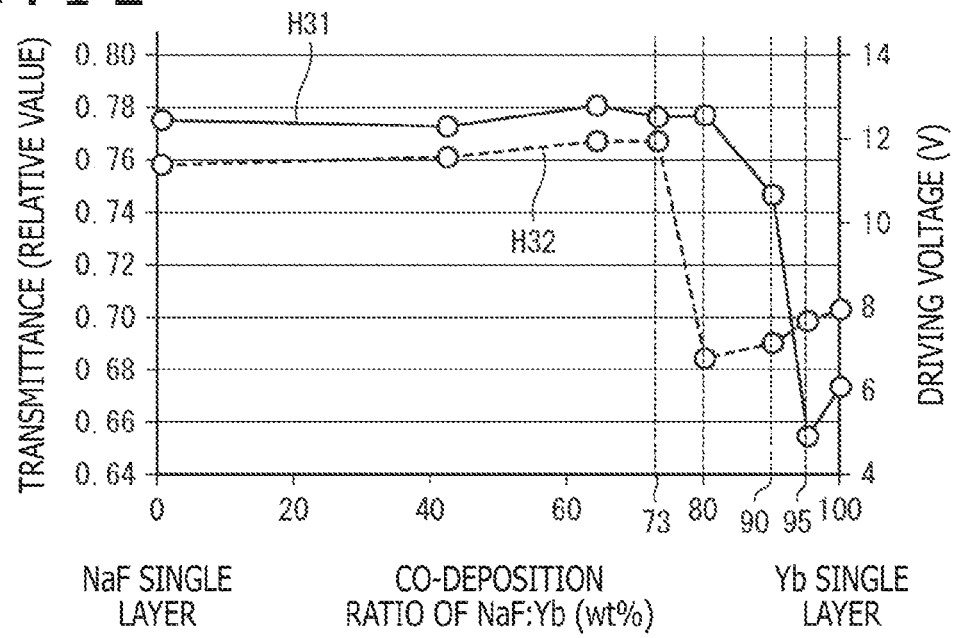
FIG. 12 is a graph depicting the results of an experiment for determining a desirable range of co-deposition ratio of an NaF:Yb layer as a functional layer in the organic EL element according to the mode of the present disclosure.

FIG. 12 is a graph depicting the relations between the co-deposition ratio of NaF:Yb and transmittance and driving voltage.

The axis of abscissas represents the co-deposition ratio in terms of weight percent (wt %) of Yb. The axis of ordinates on the left side represents transmittance of rays in a visible region, expressed in relative value in the case where the transmittance of glass is taken as "1," and the axis of ordinates on the right side represents the magnitude of driving voltage when a predetermined current value is applied.

In the graph, the solid line (H31) is a graph depicting variation in transmittance, and the broken line (H32) is a graph depicting variation in driving voltage.

Figure 13A:
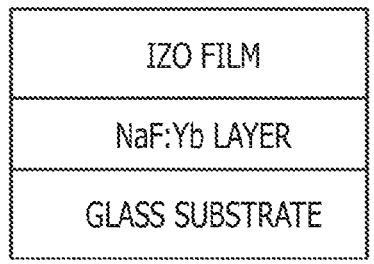
FIG. 13A denotes the structure of an object of experiment at the time of evaluation of transmittance, and FIG. 13B denotes the structure of an object of experiment at the time of evaluation of driving voltage.

Note that an experiment of transmittance adopted as an evaluation structure an assembly depicted in the schematic figure of FIG. 13A, in which an NaF:Yb layer was formed in a predetermined co-deposition ratio and in a film thickness of 15 nm over a glass substrate, and an IZO film was formed thereover in a thickness of 50 nm.

Figure 13B:
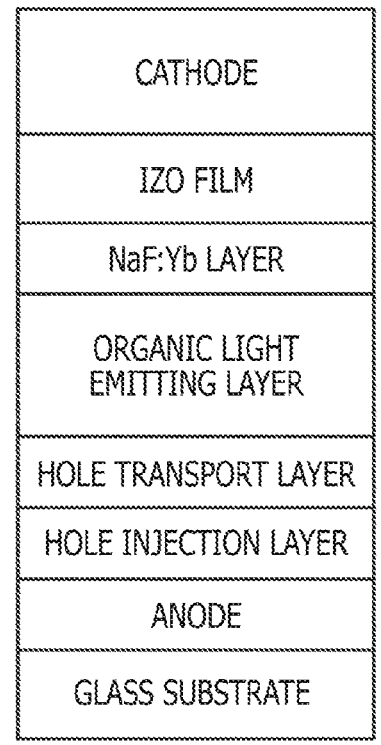

In addition, an experiment of driving voltage adopted as an evaluation structure an assembly depicted in the schematic figure of FIG. 13B, in which an anode (50 nm) by vapor deposition of Al, a hole injection layer (35 nm), a hole transport layer (20 nm) and an organic light emitting layer (50 nm) were stacked over a glass substrate, an NaF:Yb layer was formed thereover in a predetermined co-deposition ratio and in a film thickness of 15 nm, an IZO film was formed thereover in a thickness of 50 nm, and further Ag was vapor deposited thereover as a cathode in a film thickness of 80 nm.

First, paying attention to transmittance, as indicated by the solid liner H31, it is seen that a transmittance of not less than 0.74 is maintained until the co-deposition ratio becomes 90 wt %, but the transmittance is worsened suddenly when the co-deposition ratio exceeds 90 wt %.

On the other hand, as for driving voltage, as indicated by the broken line H32, it is seen that driving voltage is lowered abruptly when the co-deposition ratio exceeds 73 wt %, and the driving voltage can be suppressed until the co-deposition ratio reaches 100 wt % (while the co-deposition ratio is less than 100 wt %). Note that when the co-deposition ratio reaches 100 wt %, the same result as in the case of the second comparative example product (H22) described referring to FIG. 11 is obtained, and the driving voltage is raised. If NaF is remaining even in a small amount, however, an effect to reduce the driving voltage can be obtained. Therefore, it is desirable that the co-deposition ratio is more than 73 wt % and less than 100 wt %.

Figure 14:
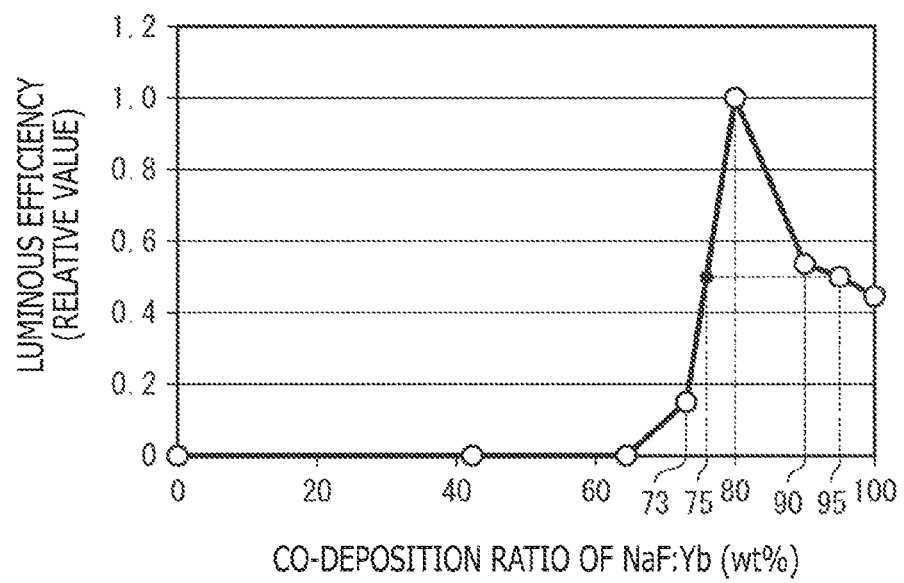
FIG. 14 is a graph depicting the relation between luminous efficiency and the co-deposition ratio of the NaF:Yb layer, in the organic EL element according to the mode of the present disclosure.

FIG. 14 is a graph of total evaluation of luminous efficiency, from the above-mentioned experimental results of transmittance and driving voltage.

In the graph, the axis of abscissas represents the co-deposition ratio of NaF:Yb in the functional layer 18 (film thickness: 15 nm), and the axis of ordinates represents the difference $\Delta E_x$ ($=E_x-E_0$) between the luminous efficiency ($E0$) when the co-deposition ratio is 0 wt % and the luminous efficiency ($E_x$) when the co-deposition ratio is X wt %, expressed in a relative value in the case where $\Delta E_{80}$ corresponding to a maximum luminous efficiency is taken as "1."

As indicated in the graph, it is seen that in the case where the co-deposition ratio is in the range of more than 73 wt % and less than 100 wt %, the luminous efficiency is increased as compared to the cases of other co-deposition ratios. Further, when the co-deposition ratio was 75 to 95 wt %, the relative value of luminous efficiency exceeded 0.5, which is a more desirable result.

6. Relation Between Film Thickness of Functional Layer and Luminous Efficiency

Figure 15:
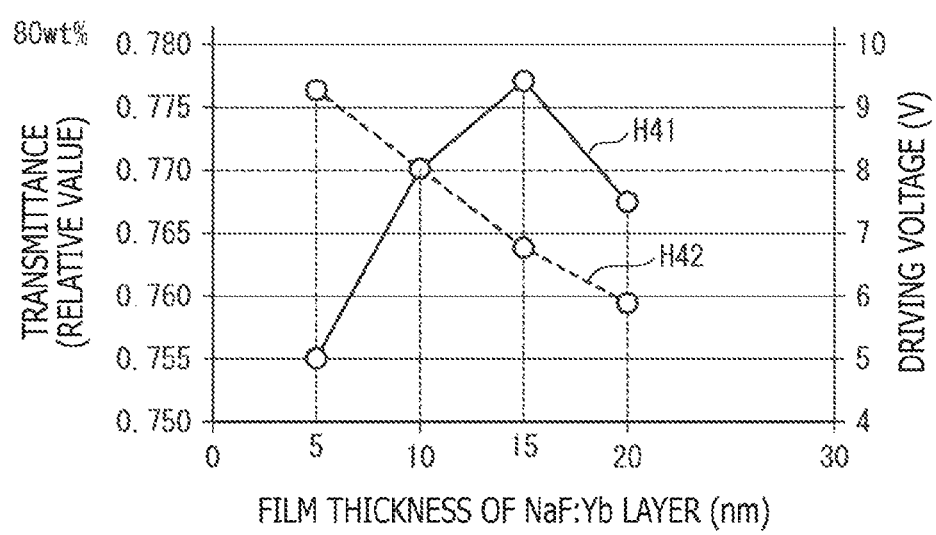
FIG. 15 is a graph depicting the results of an experiment for determining a desirable film thickness of the functional layer (NaF:Yb layer) in the organic EL element according to the mode of the present disclosure.

FIG. 15 is a graph depicting the relations between the film thickness of the functional layer (NaF:Yb layer) 18 and transmittance and driving voltage.

Note that the structure used for evaluation of transmittance was the same as that of FIG. 13A, in which the co-deposition ratio of the NaF:Yb layer was fixed at 80 wt %, and only the film thickness was varied.

In addition, the structure used for evaluation of driving voltage was the same as that of FIG. 13B, in which the co-deposition ratio of the NaF:Yb layer was fixed at 80 wt %, and only the film thickness was varied.

In the graph of FIG. 15, the axis of abscissas represents the film thickness of the NaF:Yb layer. The axis of ordinates on the left side represents the transmittance, expressed in relative value, in the case where the transmittance of glass is taken as 1, and the axis of ordinates on the right side represents the magnitude of the driving voltage.

The solid line H41 is a graph depicting variation in transmittance, while the broken line H42 is a graph depicting variation in driving voltage.

When the film thickness of the NaF:Yb layer is 10 nm, the transmittance (H41) is the same value (relative ratio 0.770) as that preliminarily measured when the co-deposition ratio of the NaF:Yb layer is 0%, and, when the film thickness of the NaF:Yb layer is less than 10 nm, the absolute amount of the oxide of Yb is also reduced, and the transmittance is lowered.

In addition, when the film thickness of the NaF:Yb layer is 10 nm, the driving voltage (H42) is the same value (8 V) as that preliminarily measured when the co-deposition ratio of the NaF:Yb layer is 100 wt %. It is considered that when the film thickness of the NaF:Yb layer is less than 10 nm, the absolute amount of the oxide of Yb is also reduced, and the driving voltage would be raised.

Besides, when the film thickness of the NaF:Yb layer exceeds 20 nm, a reduction rate of the transmittance (H41) becomes larger than the reduction rate of the driving voltage (H42), so that the luminous efficiency is lowered. Therefore, the film thickness of the NaF:Yb layer when the co-deposition ratio is 80 wt % is desirably 10 to 20 nm.

Note that when a similar experiment was conducted for a co-deposition ratio value of a little more than 73 wt % (specifically, 74 wt %) and for a co-deposition ratio value of a little less than 100 wt % (specifically, 99 wt %), it was found that when the film thickness of the NaF:Yb layer is in the range of 10 to 20 nm, luminous efficiency is improved as compared to the cases of other film thicknesses. As a result, it can be said that where the co-deposition ratio is more than 73 wt % and less than 100 wt %, it is desirable that the film thickness of the functional layer 18 is in the range of 10 to 20 nm.

7. Summary of Effects

As aforementioned, when NaF and Yb are co-deposited over the organic light emitting layer to form the functional layer and the IZO film is formed thereover, a further enhanced luminous efficiency can be expected and a prolonged life can be realized.

In this case, the co-deposition ratio of Yb is desirably more than 73 wt % and less than 100 wt %, and the film thickness of the functional layer is desirably 10 to 20 nm.

By these settings, luminous efficiency can be further improved.

Note that it is considered that such an effect is obtained because the constituents of the functional layer have the following physical properties.

(1) NaF is a fluoride of an alkaline metal, is excellent in moisture blocking property and light transmitting property, and, by vapor co-deposition of NaF with Yb which has a reducing property, part of NaF is dissociated into Na, thereby providing an electron transporting property.

(2) Yb is a rare earth metal, is a metal having a low work function, is lower in activity than alkaline metals, and, therefore, is low in reactivity with moisture and is insusceptible to deterioration. In addition, the oxide of Yb produced upon formation of the IZO film is also low in work function, and is comparable to or higher than the fluoride of an alkaline metal in transparency.

Therefore, even when other alkaline metal fluoride is used in place of NaF and other appropriate rare earth metal is used in place of Yb, a similar effect to that in the above-described embodiment can be obtained.

Note that the IZO film may also be replaced by a transparent conductive film including other inorganic oxide, for example, an ITO film. In the process of formation thereof, the other transparent conductive film also has the effect to oxidize the rare earth metal in the functional layer.

Modifications

While embodiments of the organic EL element, the organic EL panel, the method of manufacturing an organic EL element, and so on have been described above as modes of the present disclosure, the present disclosure is not limited in any way by the above descriptions, except for essential characteristic components thereof. Other modes of the present disclosure will be described below.

(1) Optical Resonator Structure

For further enhancing luminous efficiency, it is desirable to adopt an optical resonator structure.

Since the IZO film is high in transparency, its film thickness can be set comparatively large as compared to the other layers, and can be utilized for adjusting the optical lengths in the optical resonator structure.

Figure 16:
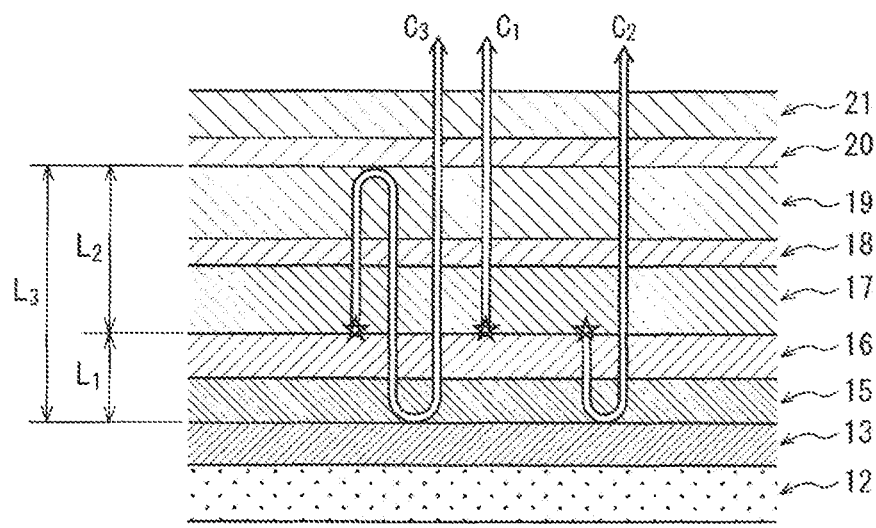
FIG. 16 is a schematic figure for explaining an optical resonator structure.

FIG. 16 is a figure for explaining interference of light in an optical resonator structure in the organic EL element 2 according to the present modification.

The optical resonator structure is configured between the interface between the pixel electrode 13 and the hole injection layer 15 and the interface between the counter electrode 20 and the IZO film 19.

FIG. 16 depicts main optical paths of light going out from the organic light emitting layer 17. An optical path C1 is an optical path along which the light going out from the organic light emitting layer 17 toward the counter electrode 20 side is transmitted directly through the counter electrode 20 without being reflected.

An optical path C2 is an optical path along which the light going out from the organic light emitting layer 17 toward the pixel electrode 13 is reflected by the pixel electrode 13, and is transmitted through the organic light emitting layer 17 and transmitted through the counter electrode 20.

It is desirable for the counter electrode 20 to have a semi-transmitting property such as to reflect part of the light coming from the lower side. Such a counter electrode 20 can be achieved by forming, for example, a film of Ag, Al or an alloy thereof in a film thickness of approximately 5 to 50 nm by a vapor deposition method.

An optical path C3 is an optical path along which the light going out from the organic light emitting layer 17 toward the counter electrode 20 side is reflected by the counter electrode 20, is further reflected by the pixel electrode 13, and is transmitted through the organic light emitting layer 17 and transmitted through the counter electrode 20.

The optical distance difference (optical path difference) $\Delta C1$ between the optical path C1 and the optical path C2 corresponds to the length of two times an optical film thickness L1 depicted in FIG. 16. The optical film thickness L1 is the total optical path (the sum total of the products of film thickness and refractive index of the layers) of the hole injection layer 15 and the hole transport layer 16, in the range from the organic light emitting layer 17 to the interface of the pixel electrode 13 with the hole injection layer 15.

In addition, the optical distance difference ΔC2 between the optical path C2 and the optical path C3 corresponds to the length of two times an optical film thickness L2 depicted in FIG. 16. The optical film thickness L2 is the optical distance (the sum total of the products of film thickness and refractive index of the layers) of the functional layer 18 and the IZO film 19, in the range from the organic light emitting layer 17 to the interface of the counter electrode 20 with the IZO film 19.

In an optical resonator structure, it is necessary to make such an adjustment that the respective lights transmitted along the optical path C1, the optical path C2 and the optical path C3 go out from the organic EL element 2 with the same phase. Therefore, let a target wavelength of the light emitted in FIG. 16 be λ, then, since reflection occurs once in the optical path C2 to produce a shift of a half wavelength, it is desirable that:

Optical path difference ΔC1=(integer times of λ)+λ/2.

In this way, one or two of the values of the film thicknesses of the hole injection layer 15, the hole transport layer 16 and the organic light emitting layer 17 and the like are set.

In addition, it is necessary to make such an adjustment that the light transmitted along the optical path C3 goes out from the organic EL element 2 with the same phase. For this purpose, since reflection occurs twice in the optical path C3, it is desirable that Optical path difference ΔC2=integer times of λ.

Besides, while the optical path difference ΔC1 is determined by the thicknesses and refractive indexes of the hole injection layer 15 and the hole transport layer 16, it is desirable that the optical path difference ΔC2 is adjusted by the thickness and refractive index of the IZO film 19. Since the IZO film 19 is high in transparency as aforementioned, a little difference in the thickness of this thin film produces little influence.

Since the wavelengths of the light emission colors are different, the film thicknesses of the hole injection layers 15, the hole transport layers 16 and the organic light emitting layers 17 and the thickness of the IZO film 19 are determined such as to set the optical path differences ΔC1 and ΔC2 according to the wavelengths.

Note that in practice, there may be present optical paths C4, C5 and so on of higher-order reflected lights going out from the counter electrode 20 through further multiple-time reflections, but a further description thereof will be omitted, since the principle of the optical resonator in that case is quite the same as the above-mentioned.

Changing the thickness of the IZO film 19 on a light emission color basis can be accomplished, for example, by preparing a sputtering mask that has openings at parts corresponding to sub-pixels of one light emission color of R, G and B, sequentially shifting the openings of the mask to the positions of sub-pixels of R, G and B, and adjusting the sputtering time for IZO at the respective positions.

(2) In Regard of Tandem-Type Organic EL Element

In the case where the organic light emitting layer is formed using a low-molecular organic material, in order to further improve luminous efficiency, there has been proposed a so-called tandem-type organic EL element in which two or more organic light emitting layers are formed between an anode and a cathode, and a charge generating layer is formed between the organic light emitting layers. The present disclosure is applicable also to such a tandem-type organic EL element.

Figure 17:
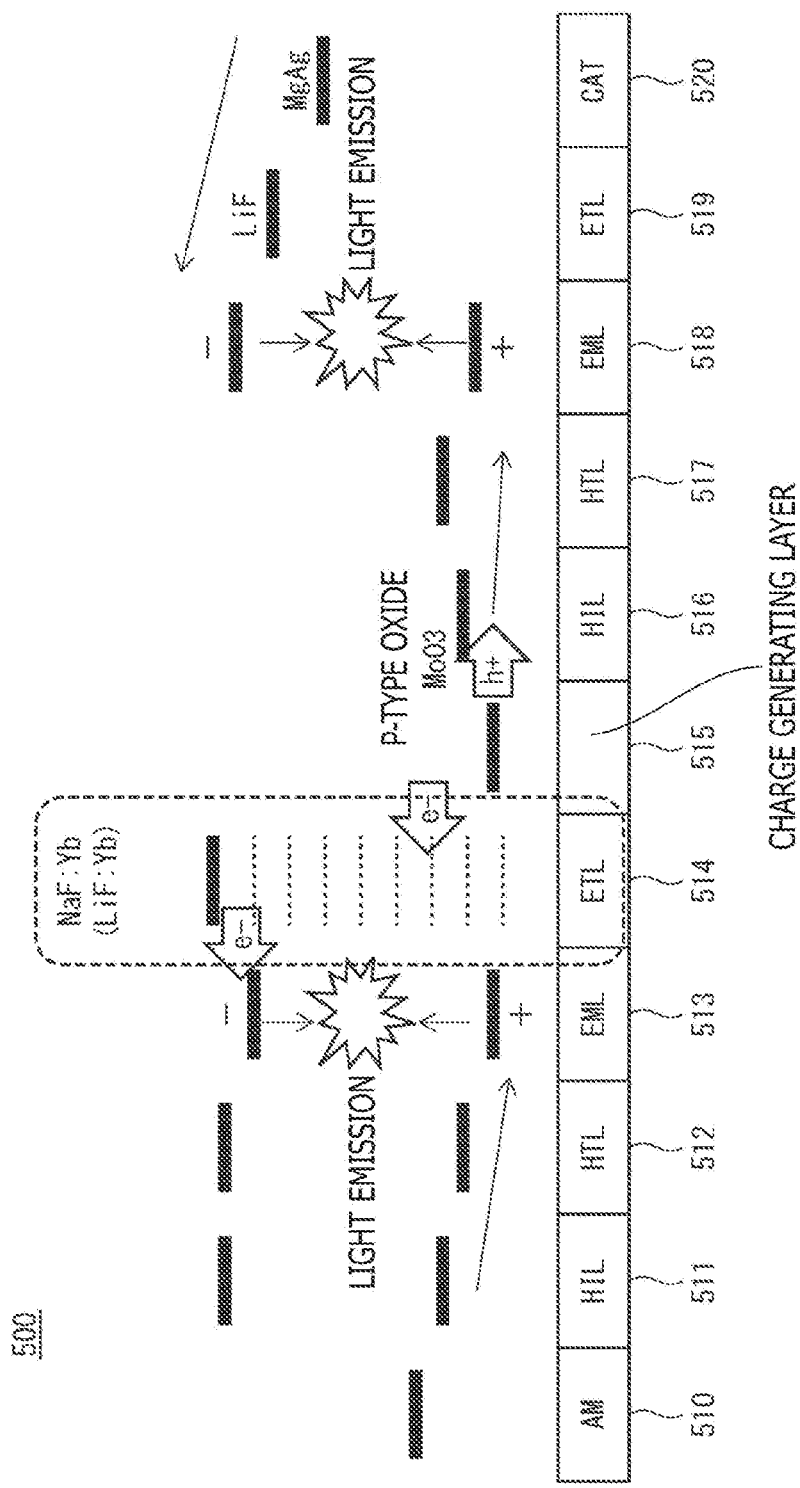
FIG. 17 is a schematic diagram depicting a stacked structure of a tandem-type organic EL element according to another mode of the present disclosure.

FIG. 17 is a schematic diagram depicting the configuration of such a tandem-type organic EL element 500, in which for convenience in representing the relation of energy levels of the layers, a stacked structure of the organic EL element 500 is depicted in the state of being aligned horizontally.

As depicted in the diagram, the organic EL element 500 has a configuration in which an anode 510 formed over a substrate (not illustrated), a hole injection layer 511, a hole transport layer 512, a first organic light emitting layer 513, an electron transport layer (functional layer) 514, a charge generating layer 515, a hole injection layer 516, a hole transport layer 517, a second organic light emitting layer 518, an electron transport layer 519, and a cathode 520 are stacked in this order from the left.

The charge generating layer 515 at an intermediate position is, in this example, formed using $MoO_3$ as an inorganic P-type oxide, and has a function of supplying holes to the hole injection layer 516 and supplying electrons to the electron transport layer 514.

The electron transport layer 514 as a functional layer is formed by co-depositing NaF and Yb in a co-deposition ratio of Yb of, for example, 80 wt %, in which part of Yb is oxidized when the charge generating layer 515 is formed thereover by a sputtering method.

Therefore, in this case, also, like the functional layer 18 in the above embodiment, the electron transport layer 514 is enhanced in light transmittance and electron injecting property, so that an effect to further enhance luminous efficiency and realize a prolonged life can be obtained.

(3) Another Mode of Method of Producing Functional Layer Precursor

In the above embodiment, the functional layer precursor has been formed by vapor co-deposition of NaF and Yb in a predetermined ratio. However, the producing method by vapor co-deposition is not necessarily limitative. For example, a method may be adopted in which particulates of NaF and Yb are evenly dispersed in an organic solvent, and the dispersion is applied by a spin coating method or the like, followed by drying.

(4) Vapor Co-deposition of Other Substance than NaF with Yb (4-1)

In the above embodiment, the functional layer 18 has been formed by vapor co-deposition of NaF and Yb in a predetermined ratio, whereby particles of NaF and Yb have been substantially evenly dispersed. When the IZO film 19 is formed over the functional layer 18 by sputtering, IZO penetrates to the inside of the functional layer 18 through gaps between the Yb particles, to form a comparatively thick layer of an oxide of Yb, whereby a high transmittance can be obtained.

Based on this principle, it is considered that a similar effect can be obtained also when other substance than NaF, for example, an organic matter having a high transmittance and Yb are co-deposited.

Figure 18:
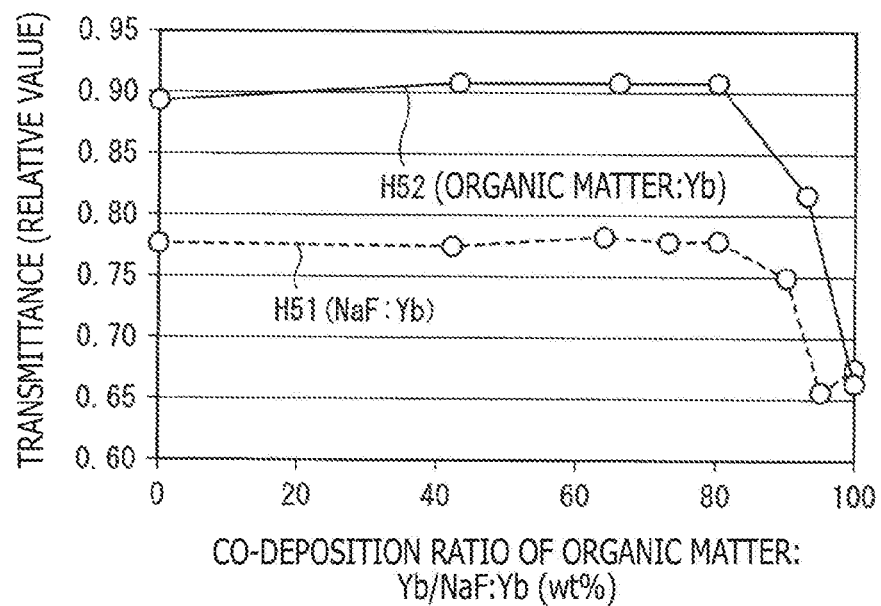
FIG. 18 is a graph depicting the relation between co-deposition ratio and transmittance in the case where an organic matter and Yb are co-deposited as a functional layer.

FIG. 18 is a graph depicting the relation between co-deposition ratio and transmittance in the case of vapor co-deposition of NaF and Yb (H51) and in the case of vapor co-deposition of an organic matter and Yb (H52).

Note that the evaluation structure for H51 was the same as that of FIG. 13A (NaF:Yb layer [15 nm], IZO film [5 nm]), whereas the evaluation structure for H52 was formed by forming an organic matter:Yb layer [15 nm] in place of the NaF:Yb layer. As the organic matter to be co-deposited, a known organic material having a light transmitting property and an electron transporting property may be used, whereby the electron injecting property and/or transporting property of the functional layer 18 can be further enhanced. In this example, a phenanthroline derivative (BCP) was used as an example of the organic material. Naturally, the rare earth metal to be co-deposited with such an organic matter does not need to have a reducing property.

As indicated by H52 in FIG. 18, it was verified that even in the case where the organic matter and Yb are co-deposited, good transmittance was maintained until the co-deposition ratio increases to approximately 95 wt %.

Note that in the case of forming the functional layer 18 by vapor co-deposition of an organic matter and Yb, it is desirable to form an NaF layer between the organic light emitting layer 17 and the functional layer 18, for a water-proofing purpose.

(4-2)

Further, it is possible to co-deposit IZO and Yb, and to use the IZO:Yb layer as a functional layer. In this case, at the stage of vapor co-deposition of IZO and Yb, part of Yb is oxidized, and, therefore, it is considered unnecessary to further form an IZO film over the functional layer 18.

(5) Modification of Stacked Structure of Organic EL Element

In the above embodiment, the stacked configuration of the organic EL element has included the functional layer 18, the IZO film 19, the hole injection layer 15 and the hole transport layer 16, but this configuration is not limitative. For example, the organic EL element does not have the hole transport layer 16. In addition, for example, a hole injection/transport layer as a single layer may be provided in place of the hole injection layer 15 and the hole transport layer 16.

Besides, another electron transport layer may be provided between the IZO film 19 over the functional layer 18 and the counter electrode 20. Examples of the material to be used for the electron transport layer in this case include n-electron low molecular weight organic materials such as oxadiazole derivatives (OXD), triazole derivatives (TAZ), and phenanthroline derivatives (BCP, Bphen). By use of such a material, the electron injecting/transporting property can be further enhanced.

(6)

In addition, if it is unnecessary to take a second or still higher order optical resonator structure into particular account, the IZO film 19 is not indispensable. There may be other methods for oxidizing Yb that is co-deposited in the functional layer 18. For example, a method of leaving to stand for a predetermined time in a high-pressure oxygen atmosphere may be considered.

Note that the depth of the layer containing the oxide of Yb contributes to enhancement of luminous efficiency, and is desirably at least not less than 50% of the film thickness of the functional layer 18.

(7) Modification of Partition Wall and Pixel Restricting Layer Forming Step

While the partition walls 14 and the pixel restricting layers 141 have been formed in separate steps in the above embodiment, the partition walls 14 and the pixel restricting layers 141 may be formed simultaneously by use of a halftone mask.

First, a resin material is applied over the interlayer insulating layer 12 formed with the pixel electrode 13 and the hole injection layers 15 by a wet process such as die coating method, to form the partition wall material layer 140 (see FIG. 5C).

After the application (coating), it is preferable, for example, to perform vacuum drying and low-temperature heating drying (pre-baking) at approximately 60° C. to 120° C. to remove unrequired solvent, and to fix the partition wall material layer to the interlayer insulating layer 12.

Next, the partition wall material layer 140 is exposed to light through a photomask (not illustrated).

For example, in the case where the partition wall material layer 140 has a positive-type photosensitive property, light is shielded at parts where to leave the partition wall material layer 140, and the parts to be removed are exposed.

The pixel restricting layers 141 are smaller than the partition walls 14 in film thickness, and, therefore, the partition wall material layer 140 should be half-exposed in areas of the pixel restricting layers 141.

Therefore, the photomask to be used for the exposure step is a halftone mask including: a light-shielding part which is disposed at positions corresponding to the partition walls 14 and which perfectly shields light; a semi-transparent part which is disposed at positions corresponding to the pixel restricting layers 141; and a transparent part which is disposed at positions corresponding to other exposed portions of the pixel electrodes 13.

The transparency (transmittance) of the semi-transparent part is determined in such a manner that upon exposure for a predetermined time, the partition wall material layer 140 over the pixel electrodes 13 is fully exposed, while the pixel restricting layers 141 are left in amounts corresponding to the height thereof, without being exposed.

Next, development is conducted to remove the exposed regions of the partition wall material layer 140, whereby the partition walls 14 and the pixel restricting layers 141 smaller than the partition walls 14 in film thickness can be formed. A specific developing method may include, for example, immersing the substrate 11 as a whole in a developing liquid such as an organic solvent or an alkaline liquid for dissolving those parts of the partition wall material layer 140 which have been exposed, and washing the substrate 11 with a rinsing liquid such as pure water. Thereafter, baking is conducted at a predetermined temperature.

By using the halftone mask as above-mentioned, the partition walls 14 extending in the Y direction and the pixel restricting layers 141 extending in the X direction can be formed over the interlayer insulating layer 12 by the same step, and the number of steps can be reduced accordingly, which contributes to a reduction in the organic EL panel manufacturing cost.

(8)

In the organic EL panel 10 according to the above embodiment, as illustrated in FIG. 2, the extending direction of the pixel restricting layers 141 has been the long axis X direction of the organic EL panel 10, and the extending direction of the partition walls 14 has been the short axis Y direction of the organic EL panel 10. However, these directions may be inverted. In addition, the extending directions of the pixel restricting layers and the partition walls may be independent of the shape of the organic EL panel 10.

In addition, while the image display surface has been rectangular as an example in the organic EL panel 10 according to the above embodiment, the shape of the image display surface is not limited, and can be modified as required.

Besides, while the pixel electrodes 13 have been rectangular flat plate-shaped members in the organic EL panel 10 according to the above embodiment, this is not restrictive.

Further, while the organic EL panel of the line bank system has been described in the above embodiment, the organic EL panel may be of a so-called pixel bank system in which each sub-pixel is surrounded by partition walls on four sides thereof.

(9)

While the sub-pixels 100R, 100G and 100B that emit light respectively in R, G and B colors have been arranged in the organic EL panel 10 according to the above embodiment, the light emission colors of the sub-pixels are not limited to these; for example, four colors including yellow (Y) in addition to R, G and B may be adopted. In addition, in one pixel P, the number of sub-pixels per color is not limited to one, and a plurality of sub-pixels may be arranged per color. Besides, the arrangement of the sub-pixels in the pixel P is not limited to the order of red color, green color and blue color, as depicted in FIG. 2, but may be in other order.

(10)

In addition, while the active matrix system has been adopted for the organic EL panel 10 according to the above embodiment, this is not limitative, and a passive matrix system may also be adopted. Besides, the present disclosure is applicable not only to a top emission type organic EL display panel but also to a bottom emission type organic EL display panel.

(11)

Figure 19:
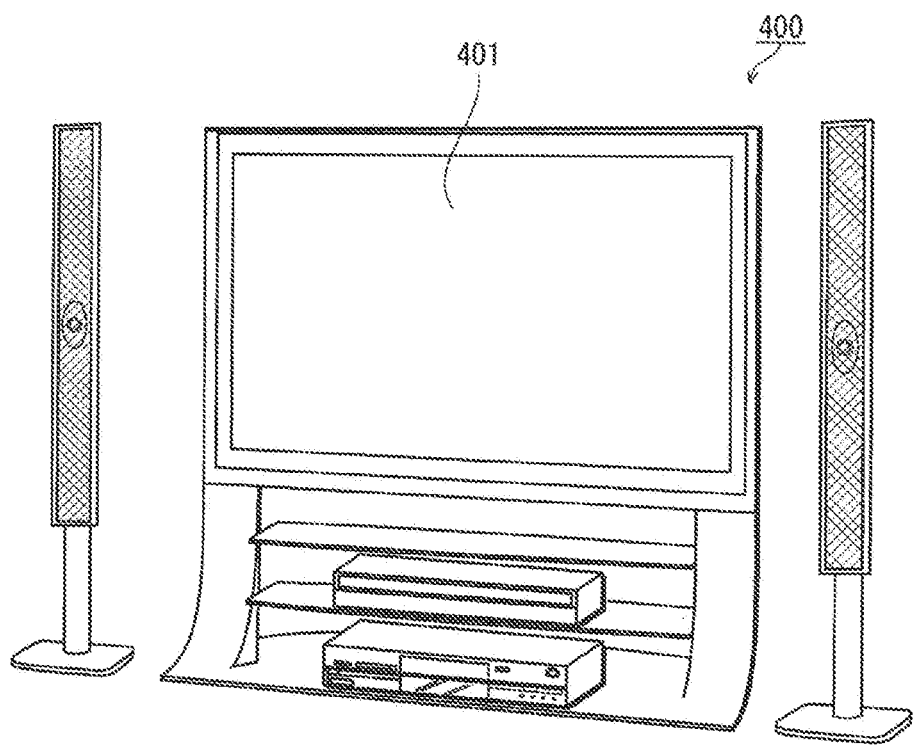
FIG. 19 is a figure depicting an example of a television device as an electronic apparatus on which the organic EL display device according to the mode of the present disclosure is mounted.

The organic EL panel according to the above embodiment can be used as a display panel for a display section 401 of a television device 400 as depicted in FIG. 19, and for other various electronic apparatuses such as personal computers, portable terminals, and displays for business use.

<<Supplement>>

While the organic EL element, the method of manufacturing the same, the organic EL panel, the organic EL display device and the electronic apparatus according to the present disclosure have been described above based on the embodiment and modifications, the present disclosure is not limited to the above embodiment and modifications. Modes obtained by applying various modifications conceived by those skilled in the art to the above embodiment and modifications, and modes realized by arbitrarily combining the components and functions of the above embodiment and modifications within the scope of the gist of the present disclosure, are also embraced by the present disclosure.

The organic EL element according to the present disclosure can be widely utilized for display panels to be used in various electronic apparatuses.

What is claimed is:

1. An organic electroluminescence element comprising:
    an anode;
    an organic light emitting layer disposed on an upper side of the anode;
    a functional layer which is disposed over the organic light emitting layer, in which a rare earth metal and other material are present mixedly, and in which part of the rare earth metal is oxidized; and
    a cathode disposed on an upper side of the functional layer,
    wherein content of the rare earth metal based on a total amount of the fluoride of the metal selected from among the alkali metals and the alkaline earth metals and the rare earth metal is more than 73 wt % and less than 100 wt %.

2. The organic electroluminescence element according to claim 1,
    wherein the other material is a fluoride of a metal selected from among alkali metals and alkaline earth metals.

3. The organic electroluminescence element according to claim 1,
    wherein the metal selected from among the alkali metals and the alkaline earth metals is Na, and the rare earth metal is Yb.

4. The organic electroluminescence element according to claim 1,
    wherein the functional layer is formed in contact with the organic light emitting layer.

5. The organic electroluminescence element according to claim 1,
    wherein a transparent conductive film including an inorganic oxide is formed in contact with the functional layer, between the functional layer and the cathode.

6. The organic electroluminescence element according to claim 5,
    wherein the transparent conductive film is an indium tin oxide film or an indium zinc oxide film.

7. The organic electroluminescence element according to claim 5,
    wherein the anode has a light reflecting property, and the cathode has a semi-transparent property.

8. The organic electroluminescence element according to claim 7,
    wherein light emitted from the organic light emitting layer includes a first light flux going out directly from the cathode and a second light flux going out from the cathode after being reflected between the anode and the cathode, and a film thickness of the transparent conductive film is set according to a wavelength of a color in which the light is emitted in such a manner that the first light flux and the second light flux resonate.

9. The organic electroluminescence element according to claim 1,
    wherein an electron transport layer is formed between the functional layer and the cathode.

10. The organic electroluminescence element according to claim 1,
    wherein the other material is an organic material.

11. The organic electroluminescence element according to claim 1,
    wherein the other material is an oxide.

12. The organic electroluminescence element according to claim 1,
    wherein two or more organic light emitting layers are formed between the anode and the cathode, a charge generating layer is formed between the organic light emitting layers, the functional layer is formed in contact with the charge generating layer between at least one of the organic light emitting layers and the charge generating layer, and the charge generating layer includes a metallic oxide.

13. The organic electroluminescence element according to claim 12,
    wherein the metallic oxide is an oxide of Mo.

* * * * *